US011863896B2

(12) United States Patent
Moue

(10) Patent No.: US 11,863,896 B2
(45) Date of Patent: Jan. 2, 2024

(54) IMAGE SENSOR AND PHOTODETECTOR WITH TRANSISTOR DIODE-CONNECTED VIA A RESISTANCE ELEMENT

(71) Applicant: SONY SEMICONDUCTOR SOLUTIONS CORPORATION, Kanagawa (JP)

(72) Inventor: Takashi Moue, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 377 days.

(21) Appl. No.: 17/275,828

(22) PCT Filed: Aug. 8, 2019

(86) PCT No.: PCT/JP2019/031311
§ 371 (c)(1),
(2) Date: Mar. 12, 2021

(87) PCT Pub. No.: WO2020/066327
PCT Pub. Date: Apr. 2, 2020

(65) Prior Publication Data
US 2022/0046197 A1 Feb. 10, 2022

(30) Foreign Application Priority Data
Sep. 26, 2018 (JP) .................. 2018-180800

(51) Int. Cl.
*H04N 25/75* (2023.01)
*H03K 5/22* (2006.01)
(Continued)

(52) U.S. Cl.
CPC .............. *H04N 25/75* (2023.01); *H03K 5/22* (2013.01); *H04N 25/709* (2023.01); *H01L 27/14612* (2013.01)

(58) Field of Classification Search
CPC .......... H04N 25/75; H04N 25/78; H03K 5/22; H01L 27/14612
See application file for complete search history.

(56) References Cited

U.S. PATENT DOCUMENTS 7,781,734 B2 * 8/2010 Chammings ........... H04N 25/00
250/332
8,149,309 B2 4/2012 Tanaka
(Continued)

FOREIGN PATENT DOCUMENTS

| CN | 107682648 A | 2/2018 |
| JP | 2000-77988 A | 3/2000 |

(Continued)

OTHER PUBLICATIONS

International Search Report and Written Opinion of PCT Application No. PCT/JP2019/031311, dated Nov. 5, 2019, 09 pages of ISRWO.

*Primary Examiner* — Nicholas G Giles
(74) *Attorney, Agent, or Firm* — CHIP LAW GROUP

(57) ABSTRACT

An object of the present technology is to provide an image sensor and a photodetector that are capable of reducing power consumption of an AD conversion unit. The image sensor includes a comparator, in which the comparator includes a differential input unit that includes a first input unit connected to a first capacitance unit and a second input unit connected to a second capacitance unit, a current mirror unit that includes a first resistance element connected to the differential input unit and an NMOS transistor diode-connected via the first resistance element, a second resistance element connected to the differential input unit, and a switch unit provided between the first input unit and a junction between the first resistance element and the NMOS transistor, and between the second input unit and a junction (Continued)

between the second resistance element and the current mirror unit.

20 Claims, 15 Drawing Sheets

(51) Int. Cl.
    *H04N 25/709*      (2023.01)
    *H01L 27/146*      (2006.01)

(56) References Cited

U.S. PATENT DOCUMENTS

| | | |
|---|---|---|
| 8,625,014 B2 | 1/2014 | Yoo |
| 9,071,783 B2 | 6/2015 | Ueno et al. |
| 2009/0014652 A1* | 1/2009 | Chammings ............. H04N 5/33 348/E5.09 |
| 2018/0109748 A1 | 4/2018 | Ueno et al. |

FOREIGN PATENT DOCUMENTS

| | | |
|---|---|---|
| JP | 2014-23065 A | 2/2014 |
| JP | 2018-148541 A | 9/2018 |
| TW | 200501001 A | 1/2005 |
| WO | 2018/159343 A1 | 9/2018 |

* cited by examiner

IMAGE SENSOR AND PHOTODETECTOR WITH TRANSISTOR DIODE-CONNECTED VIA A RESISTANCE ELEMENT

CROSS REFERENCE TO RELATED APPLICATIONS

This application is a U.S. National Phase of International Patent Application No. PCT/JP2019/031311 filed on Aug. 8, 2019, which claims priority benefit of Japanese Patent Application No. JP 2018-180800 filed in the Japan Patent Office on Sep. 26, 2018. Each of the above-referenced applications is hereby incorporated herein by reference in its entirety.

TECHNICAL FIELD

The present technology relates to an image sensor and a photodetector.

BACKGROUND ART

Conventionally, there has been known a solid-state imaging device that includes a pixel unit including a plurality of pixels arranged in a matrix (see, for example, Patent Literature 1). The solid-state imaging device includes an AD conversion unit for AD (analog-to-digital)-converting an analog pixel signal based on an electrical signal that has been photoelectrically converted by a photoelectric conversion element provided in the plurality of pixels. An image is displayed on a display device or the like on the basis of the digital pixel signal AD-converted by the AD conversion unit.

CITATION LIST

Patent Literature

Patent Literature 1: Japanese Patent Application Laid-open No. 2014-023065

DISCLOSURE OF INVENTION

Technical Problem

A comparator is used for an AD conversion unit. The comparator includes a current source, a differential input circuit, and a current mirror circuit. The power-source voltage of the comparator cannot be reduced lower than the minimum voltage at which the current source, the differential input circuit, and the current mirror circuit are capable of operating normally. For this reason, there is a problem that power consumption of the AD conversion unit cannot be sufficiently reduced because it is rate-limited by the power source voltage of the comparator.

It is an object of the present technology to provide an image sensor and a photodetector that are capable of reducing power consumption of an AD conversion unit.

Solution to Problem

An image sensor according to an embodiment of the present technology includes: a pixel that includes a photoelectric conversion element; a signal line connected to the pixel; and a comparator connected to the signal line, in which the comparator includes a differential input unit that includes a first input unit connected to a first capacitance unit and a second input unit connected to a second capacitance unit, a current mirror unit that includes a first resistance element connected to the differential input unit and a transistor diode-connected via the first resistance element, a second resistance element connected to the differential input unit, and a switch unit provided between the first input unit and a junction between the first resistance element and the transistor, and between the second input unit and a junction between the second resistance element and the current mirror unit.

A photodetector according to an embodiment of the present technology includes: a pixel that includes a photoelectric conversion element; a signal line connected to the pixel; and a comparator connected to the signal line, in which the comparator includes a differential input unit that includes a first input unit connected to a first capacitance unit and a second input unit connected to a second capacitance unit, a current mirror unit that includes a first resistance element connected to the differential input unit and a transistor diode-connected via the first resistance element, a second resistance element connected to the differential input unit, and a switch unit provided between the first input unit and a junction between the first resistance element and the transistor, and between the second input unit and a junction between the second resistance element and the current mirror unit.

MODE(S) FOR CARRYING OUT THE INVENTION

An image sensor and a photodetector according to an embodiment of the present technology will be described using FIG. 1 to FIG. 16. Hereinafter, this embodiment will be described by exemplifying an image sensor.

<Configuration Example of Digital Camera>

A digital camera to which the image sensor according to this embodiment is applied will be described first using FIG. 1. A digital camera to which the image sensor according to the present technology has been applied is capable of capturing both a still image and a moving image.

Figure 1:
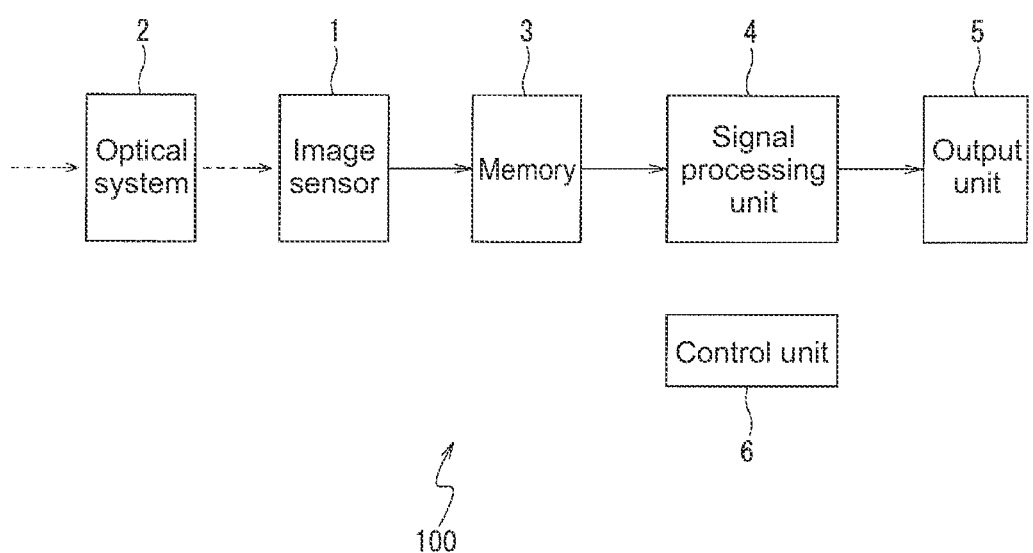
FIG. 1 is a block diagram showing a schematic configuration of a digital camera to which an image sensor according to the present technology has been applied.

As shown in FIG. 1, a digital camera 100 includes an optical system 2, an image sensor 1, a memory 3, a signal processing unit 4, an output unit 5, and a control unit 6.

The optical system 2 includes, for example, a zoom lens, a focus lens, and an aperture (which are not shown). The optical system 2 is configured to cause external light to enter the image sensor 1.

The image sensor 1 is, for example, a CMOS image sensor. The image sensor 1 is configured to receive incident light that has entered from the optical system 2, and perform photoelectric conversion on the received incident light. Thus, the image sensor 1 is configured to output image data corresponding to the incident light that has entered from the optical system 2.

The memory 3 is configured to temporarily store the image data to be output by the image sensor 1.

The signal processing unit 4 is configured to perform signal processing using the image data stored in the memory 3, and supply the image data after the signal processing to the output unit 5. For example, the signal processing unit 4 performs processing such as removing noise mixed in the image data and adjusting white balance.

The output unit 5 outputs the image data supplied from the signal processing unit 4. The output unit 5 includes, for example, a display device (not shown) including liquid crystal or the like. The output unit 5 is configured to display, as a so-called through image, an image corresponding to the image data supplied from the signal processing unit 4.

Further, the output unit 5 includes a driver (not shown) for driving a recording medium such as a semiconductor memory, a magnetic disk, and an optical disk. The output unit 5 is configured to record the image data supplied from the signal processing unit 4 on the recording medium.

The control unit 6 is configured to control the blocks constituting the digital camera 100 in accordance with operations of the digital camera 100 by a user or the like.

<Configuration Example of Image Sensor>

Next, a schematic configuration of the image sensor according to this embodiment will be described using FIG. 2 to FIG. 9.

Figure 2:
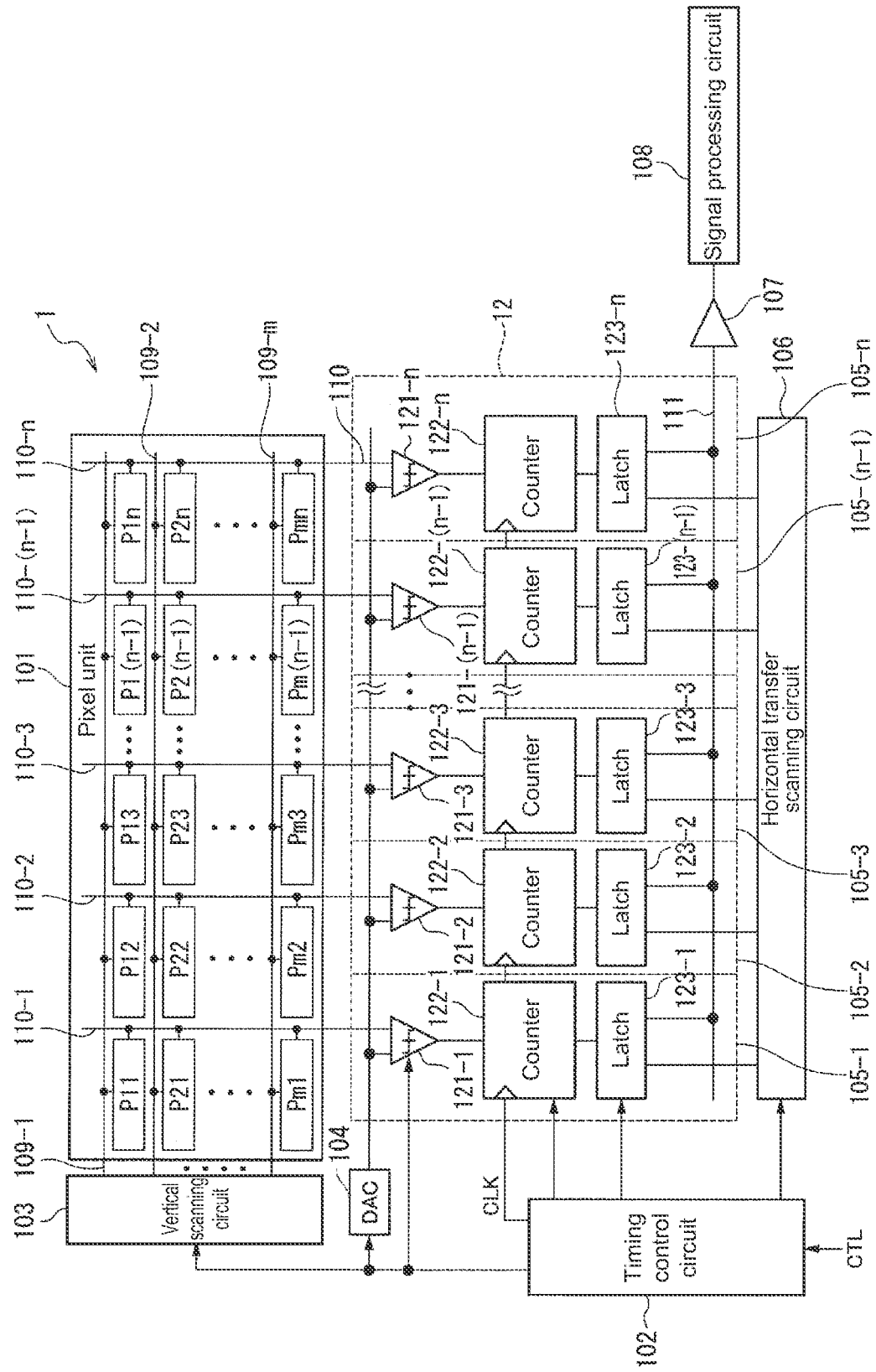
FIG. 2 is a block diagram showing a schematic configuration of an image sensor according to an embodiment of the present technology.

As shown in FIG. 2, the image sensor 1 according to this embodiment includes a pixel unit 101, a timing control circuit 102, a vertical scanning circuit 103, a DAC (digital-analog converter) 104, an ADC (analog-digital convertor) group 12, a horizontal transfer scanning circuit 106, an amplifier circuit 107, and a signal processing circuit 108.

As shown in FIG. 2, in the pixel unit 101, unit pixels (hereinafter, referred to also simply as pixels) including a photoelectric conversion element for photoelectrically converting incident light into a charge amount corresponding to the amount of the incident light are arranged in a matrix. That is, the image sensor 1 includes a pixel including a photoelectric conversion element. In this embodiment, the pixel unit 101 is provided with unit pixels P11 to Pmn in m rows and n columns (m and n are natural numbers) (hereinafter, all or a part of the unit pixels P11 to Pmn will be referred to simply as "unit pixels P" in the case where it is unnecessary to individually distinguish them from each other). In FIG. 2, a part (14) of the unit pixels P of the pixel array of m rows and n columns is illustrated. The unit pixels P11 to Pmn have the same circuit configuration. The specific circuit configuration of the unit pixels P11 to Pmn will be described below with reference to FIG. 3.

Further, in the pixel unit 101, m pixel drive lines 109-1 to 109-*m* are wired along the right-and-left direction of the drawing (pixel array direction of the pixel row/horizontal direction) with respect to the matrix-like pixel array. Further, in the pixel unit 101, n vertical signal lines (example of a vertical signal line) 110-1 to 110-*n* are wired along the up-and-down direction of the drawing (pixel array direction of the pixel column/vertical direction). One end of each of the pixel drive lines 109-1 to 109-*m* is connected to an output end of the vertical scanning circuit 103 in the corresponding row. The respective unit pixels P11 to Pmn are arranged corresponding to the intersections of the pixel drive lines 109-1 to 109-*m* and the vertical signal lines 110-1 to 110-*n*. That is, the image sensor 1 includes a signal line connected to a pixel. Note that although each of the pixel drive lines 109-1 to 109-*m* is shown as one line for each pixel row in FIG. 2, two or more lines may be provided for each pixel row as each of the pixel drive lines 109-1 to 109-*m*. Hereinafter, in the case where the vertical signal lines 110-1 to 110-*n* do not need to be individually distinguished from each other, they will be simply referred to as "vertical signal lines 110". In the case where the pixel drive lines 109-1 to 109-*m* do not need to be individually distinguished from each other, they will be simply referred to as "pixel drive lines 109".

The timing control circuit 102 includes a timing generator (not shown) that generates various timing signals. The timing control circuit 102 performs drive control on the vertical scanning circuit 103, the DAC 104, the ADC group 12, the horizontal transfer scanning circuit 106, and the like on the basis of various timing signals, which are generated by the timing generator, on the basis of an externally provided control signal or the like.

The vertical scanning circuit 103 includes a shift register, an address decoder, and the like. Although illustration of a specific configuration is omitted here, the vertical scanning circuit 103 includes a reading scanning system and a sweep scanning system.

The reading scanning system performs selective scanning on unit pixels from which signals are to be read, in order on a row-by-row basis. Meanwhile, the sweep scanning system performs sweep scanning of sweeping out (resetting) unnecessary charges from the photoelectric conversion elements of the unit pixels in the read row on which the read scanning is to be performed by the reading scanning system, prior to the read scanning by the amount of time corresponding to the shutter speed. By the sweeping out (resetting) of the unnecessary charges by the sweep scanning system, a so-called electronic shutter operation is performed. Here, the electronic shutter operation refers to the operation in which the optical charges of the photoelectric conversion element are discarded and exposure is newly started (accumulation of optical charges is started). The signal read by the read operation by the reading scanning system corresponds to the amount of light that has entered after the immediately preceding read operation or the electronic shutter operation. Then, the period from the read timing by the immediately preceding read operation or the sweep timing by the electronic shutter operation to the read timing by the current read operation is the accumulation time (exposure time) of the optical charges in the unit pixel.

A pixel signal VSL output from each of the unit pixels in the pixel row selectively scanned by the vertical scanning circuit 103 is supplied to the ADC group 12 via the vertical signal lines 110 in each column.

The DAC 104 generates a reference signal RAMP, which is a linearly increasing ramp-waveform signal, and supplies it to the ADC group 12.

The ADC group 12 includes ADCs 105-1, 105-2, 105-3 to 105-($n-1$), and 105-$n$ connected to the vertical signal lines 110-1, 110-2, 110-3 to 110-($n-1$), and 110-$m$. The ADCs 105-1, 105-2, 105-3 to 105-($n-1$), and 105-$n$ include comparators 121-1, 121-2, 121-3 to 121-($n-1$), and 121-$n$, counters 122-1, 122-2, 122-3 to 122-($n-1$), and 122-$n$, and latches 123-1, 123-2, 123-3 to 123-($n-1$), and 123-$n$. Note that hereinafter, in the case where the ADCs 105-1 to 105-$n$, the comparators 121-1 to 121-$n$, the counter 122-1 to the counter 122-$n$, and the latch 123-1 to the latch 123-$n$ do not need to be individually distinguished from each other, they will be respectively referred to simply as the ADCs 105, the comparators 121, the counters 122, and the latches 123.

One comparator 121, one counter 122, and one latch 123 are provided for each of the vertical signal lines 110 of the pixel unit 101, and constitute the ADC 105. That is, the ADC 105 is provided for each of the vertical signal lines 110 of the pixel unit 101 in the ADC group 12.

The image sensor 1 includes the comparator 121 connected to the vertical signal line 110. The comparator 121 compares the voltage of the signal obtained by adding the pixel signal VSL output from the respective pixels and the reference signal RAMP via the capacitance with a predetermined reference voltage, and supplies an output signal indicating the comparison result to the counter 122. A detailed configuration of the comparator 121 will be described below.

The counter 122 converts, by counting the time until the signal obtained by adding the pixel signal VSL and the reference signal RAMP via the capacitance exceeds the predetermined reference voltage, the analog pixel signal into a digital pixel signal represented by the count value, on the basis of the output signal of the comparator 121. The counter 122 provides the count value to the latch 123.

The latch 123 holds the count value supplied from the counter 122. Further, the latch 123 performs correlated double sampling (CDS) by taking the difference between the count value of a D phase corresponding to a pixel signal of a signal level and the count value of a P phase corresponding to a pixel signal of a reset level.

The ADCs 105-1 to 105-$n$ are arranged so as to correspond to n unit pixels Pi1 to Pin (i=1, 2, 3, to, m) arranged in one row of the unit pixels P provided in the pixel unit 101. Hereinafter, a region on the semiconductor chip allocated for disposing one ADC 105 will be referred to as a "column region".

The horizontal transfer scanning circuit 106 includes a shift register, an address decoder, and the like, and selectively scans circuit portions corresponding to the pixel column of the ADC group 12 in order. By the selective scanning by the horizontal transfer scanning circuit 106, the digital pixel signal held in the latch 123 is transferred to the amplifier circuit 107 via a horizontal transfer line 111 in order.

The amplifier circuit 107 amplifies the digital pixel signal supplied from the latch 123 and supplies it to the signal processing circuit 108.

The signal processing circuit 108 performs predetermined signal processing on the digital pixel signal supplied from the amplifier circuit 107, and generates two-dimensional image data. For example, the signal processing circuit 108 performs correction of vertical line imperfections and point imperfections, or clamping of signals, or performs digital signal processing such as parallel-to-serial conversion, compression, coding, addition, averaging, and an intermittent operation. The signal processing circuit 108 outputs the generated image data to the subsequent device.

<Configuration Example of Pixel>

Figure 3:
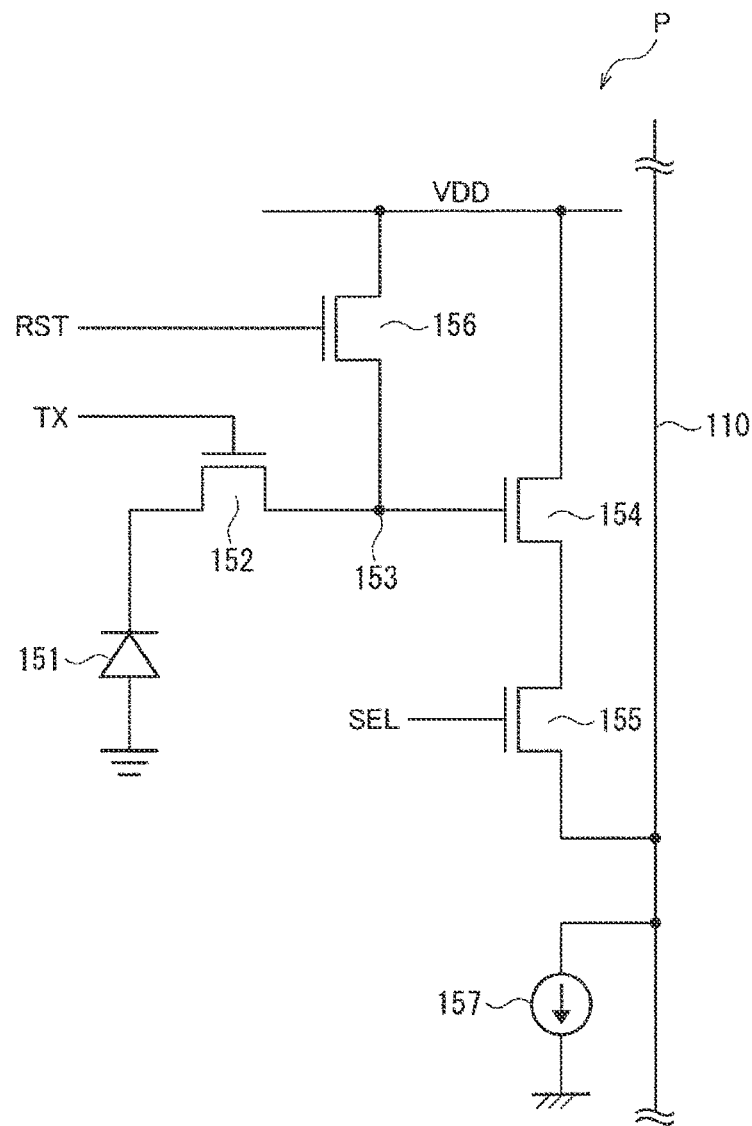
FIG. 3 is a circuit diagram showing a configuration example of a unit pixel provided in the image sensor according to the embodiment of the present technology.

FIG. 3 is a circuit diagram showing a configuration example of the unit pixels P11 to Pmn provided in the pixel unit 101. The unit pixels P11 to Pmn have the same configuration.

The unit pixel P includes, for example, a photodiode 151 as a photoelectric conversion element. The unit pixel P includes, as active elements, four transistors, i.e., a transfer transistor 152, an amplifier transistor 154, a selection transistor 155, and a reset transistor 156.

The photodiode 151 photoelectrically converts incident light into an amount of charges (here, electrons) corresponding to the amount of the incident light.

The transfer transistor 152 is connected between the photodiode 151 and an FD (floating diffusion) 153. When being turned on by a drive signal TX supplied from the vertical scanning circuit 103, the transfer transistor 152 transfers the charges accumulated in the photodiode 151 to the FD 153.

A gate of the amplifier transistor 154 is connected to the FD 153. The amplifier transistor 154 is connected to the vertical signal lines 110 via the selection transistor 155 and constitutes a source follower together with a constant current source 157 outside the pixel unit 101. When the selection transistor 155 is turned on by a drive signal SEL supplied from the vertical scanning circuit 103, the amplifier transistor 154 amplifies the potential of the FD 153 and outputs a pixel signal indicating a voltage corresponding to the potential to the vertical signal lines 110. Then, the pixel signals output from the unit pixels P are supplied to the comparators 121 of the ADC group 12 via the vertical signal lines 110.

The reset transistor 156 is connected between a power source VDD and the FD 153. When the reset transistor 156 is turned on by the driving signal RST supplied from the vertical scanning circuit 103, the potential of the FD 153 is reset to the potential of the power source VDD.

The FD 153 is formed at the connection point between the transfer transistor 152, the amplifier transistor 154, and the reset transistor 156. The transfer transistor 152, the amplifier transistor 154, the reset transistor 156, and the selection transistor 155 each include, for example, an N-type metal-oxide-semiconductor field-effect transistor (MOSFET).

<Configuration Example of Comparator>

The comparators 121-1 to 121-n provided in the ADC group 12 have the same configuration and exhibit the same function.

Figure 4:
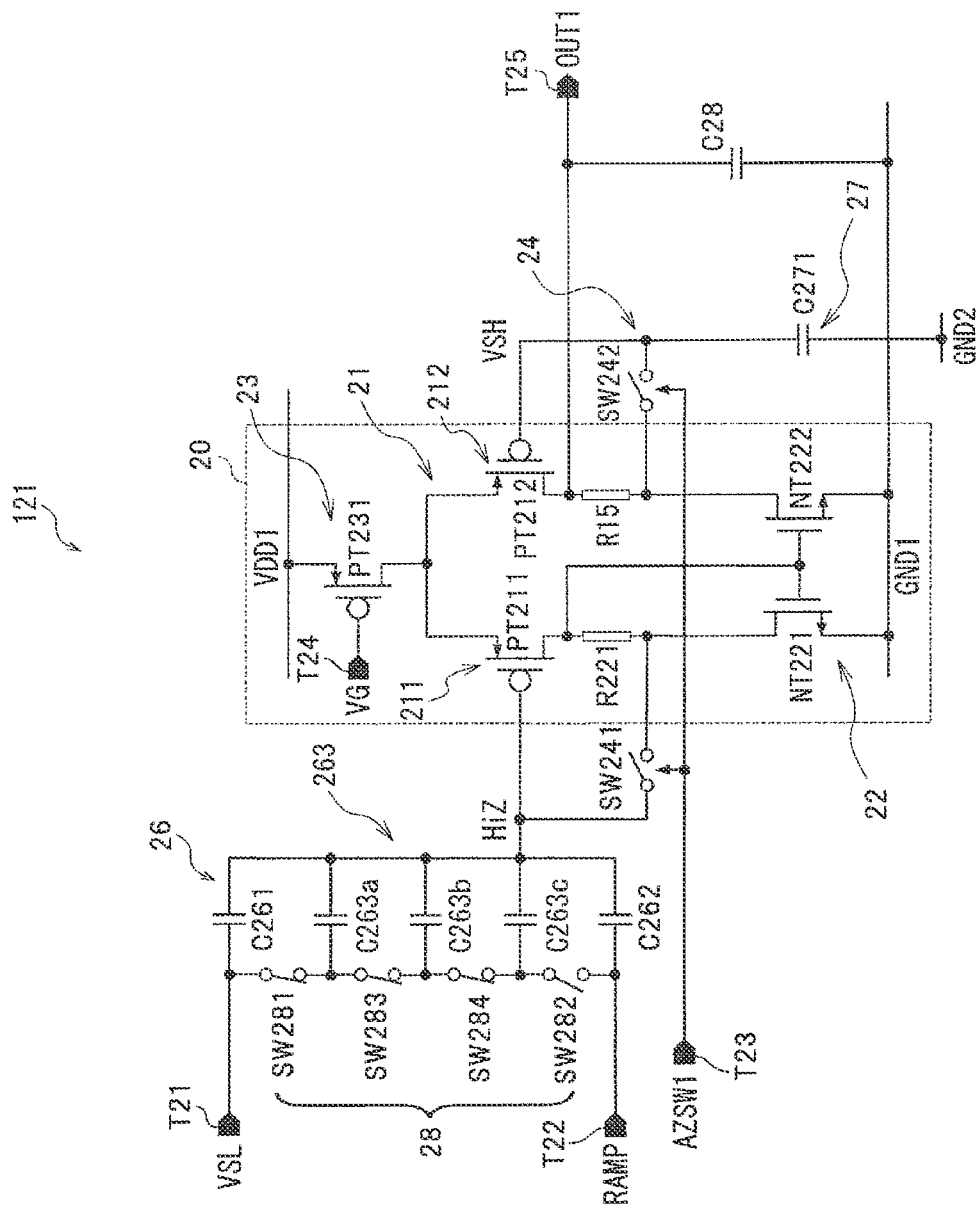
FIG. 4 is a circuit diagram showing a configuration example of a comparator provided in the image sensor according to the embodiment of the present technology.

As shown in FIG. 4, the comparator 121 includes a differential input unit 21 that includes a first input unit 211 connected to the vertical signal line 110 (not shown in FIG. 4, see FIG. 2) via a first capacitance unit 26, and a second input unit 212 connected to a second capacitance unit 27. Further, the comparator 121 includes a current mirror unit 22 that includes a transistor diode-connected via a first resistance element R221. As will be described below in detail, the transistor is an N-type MOS (NMOS) transistor NT221. Further, the comparator 121 includes a second resistance element R15 connected to the differential input unit 21. Further, the comparator 121 includes a switch unit 24 provided between the first input unit 211 and a junction between the first resistance element R221 and the transistor (i.e., the NMOS transistor NT221), and between the second input unit 212 and a junction between the second resistance element R15 and the current mirror unit 22.

Each of the first resistance element R221 and the second resistance element R15 has, for example, a passive element structure. The first resistance element R221 and the second resistance element R15 have the same structure. At least a part of each of the first resistance element R221 and the second resistance element R15 is formed of polysilicon. The first resistance element R221 and the second resistance element R15 have the same resistance value. In this embodiment, each of the first resistance element R221 and the second resistance element R15 includes a passive element. However, each of the first resistance element R221 and the second resistance element R15 may include an active element. For example, each of the first resistance element R221 and the second resistance element R15 may include a transistor to which a voltage is applied to the gate so as to be in a predetermined on-resistance state.

The comparator 121 includes a tail current source 23 connected to the differential input unit 21. The tail current source 23 includes a P-type MOS (PMOS) transistor PT231. The differential input unit 21, the current mirror unit 22, and the tail current source 23 constitute a differential amplifier 20.

The differential input unit 21 includes a PMOS transistor PT211 (example of a first transistor) that constitutes the first input unit 211, and a PMOS transistor PT212 (example of a second transistor) that constitutes the second input unit 212. The current mirror unit 22 includes the NMOS transistor NT221 (example of a third transistor) that is a transistor diode-connected via the first resistance element R221, and an NMOS transistor NT222 (example of a fourth transistor) connected to the second resistance element R15.

The switch unit 24 includes a switch SW241 (example of a first switch) provided between a junction between the PMOS transistor PT211 and the first capacitance unit 26 and a junction between the first resistance element R221 and the NMOS transistor NT221. Further, the switch unit 24 includes a switch SW242 (example of a second switch) provided between a junction between the PMOS transistor PT212 and the second capacitance unit 27 and a junction between the second resistance element R15 and the NMOS transistor NT222.

One terminal of the first resistance element R221 is connected to a drain of the PMOS transistor PT211 of the differential input unit 21, a gate of the NMOS transistor NT221 of the current mirror unit 22, and a gate of the NMOS transistor NT222. Further, a different terminal of the first resistance element R221 is connected to a drain of the NMOS transistor NT211 and the switch SW241. One terminal of the second resistance element R15 is connected to a drain of the PMOS transistor PT212. A different terminal of the second resistance element R15 is connected to a drain of the NMOS transistor NT222 and the switch SW242.

A source of the PMOS transistor PT211 is connected to a source of the PMOS transistor PT212 and a drain of the PMOS transistor PT231 of the tail current source 23. A gate of the PMOS transistor PT211 is connected to the first capacitance unit 26. A gate of the PMOS transistor PT212 is connected to the second capacitance unit 27.

A source of the NMOS transistor NT221 of the current mirror unit 22 and a source of the NMOS transistor NT222 are connected to a ground GND1.

A source of the PMOS transistor PT231 is connected to a power source VDD1. A gate of the PMOS transistor PT231 is connected to an input terminal T24 to which a bias voltage VG is input.

A junction between the PMOS transistor PT212 and the second resistance element R15 is connected to an output terminal T25 from which an output signal OUT1 is output. More specifically, the output terminal T25 is connected to the drain of the PMOS transistor PT212 and the one terminal of the second resistance element R15.

In the current mirror unit 22, the NMOS transistor NT221, the NMOS transistor NT222, and the first resistance element R221 constitute a current mirror circuit. Further, the differential input unit 21 and the tail current source 23 constitute a differential comparator. In other words, the PMOS transistor PT211, the PMOS transistor PT212, and the PMOS transistor PT231 constitute a differential comparator. The PMOS transistor PT231 operates as a current source by the bias voltage VG input from the outside via the input terminal T24, and the PMOS transistor PT211 and the PMOS transistor PT212 operate as differential transistors.

As shown in FIG. 4, the switch SW241 is connected between the drain-gate of the PMOS transistor PT211 via the first resistance element R221. More specifically, one terminal of the switch SW241 is connected to the gate of the PMOS transistor PT211. A different terminal of the switch SW241 is connected to the different terminal of the first resistance element R221. Further, the different terminal of the switch SW241 is connected also to a drain of the NMOS transistor NT221. The one terminal of the first resistance element R221 is connected to the drain of the PMOS transistor PT211. Therefore, the switch SW241 is connected between the drain-gate of the PMOS transistor PT211 via the first resistance element R221. Further, in other words, the switch SW241 and the first resistance element R221 are connected in series between the drain-gate of the PMOS transistor PT211. The switch SW241 is switched from the on state to the off state or from the off state to the on state by a drive signal AZSW1 input from the timing control circuit 102 (see FIG. 2) via an input terminal T23. In the case where the switch SW241 is in the on state, the drain-gate of the PMOS transistor PT211 are connected to each other via the switch SW241 and the first resistance element R221. For this reason, in the case where the switch SW241 is in the on state, the PMOS transistor PT211 is in the state of being diode-connected via the switch SW241 and the first resistance element R221.

The switch SW242 is connected to the drain-gate of the PMOS transistor PT212 via the second resistance element R15. More specifically, one terminal of the switch SW242 is connected to the gate of the PMOS transistor PT212. A different terminal of the switch SW242 is connected to the different terminal of the second resistance element R15. Further, the different terminal of the switch SW242 is connected also to the drain of the NMOS transistor NT222. The one terminal of the second resistance element R15 is connected to the drain of the PMOS transistor PT212. Therefore, the switch SW242 is connected between the drain-gate of the PMOS transistor PT212 via the second resistance element R15. Further, in other words, the switch SW242 and the second resistance element R15 are connected in series between the drain-gate of the PMOS transistor PT212. The switch SW242 is switched from the on state to the off state or from the off state to the on state by the drive signal AZSW1 input from the timing control circuit 102 (see FIG. 2) via the input terminal T23. In the case where the switch SW242 is in the on state, the drain-gate of the PMOS transistor PT212 are connected to each other via the switch SW242 and the second resistance element R15. For this reason, in the case where the switch SW242 is in the on state, the PMOS transistor PT212 is in the state of being diode-connected via the switch SW242 and the second resistance element R15.

Figure 5:
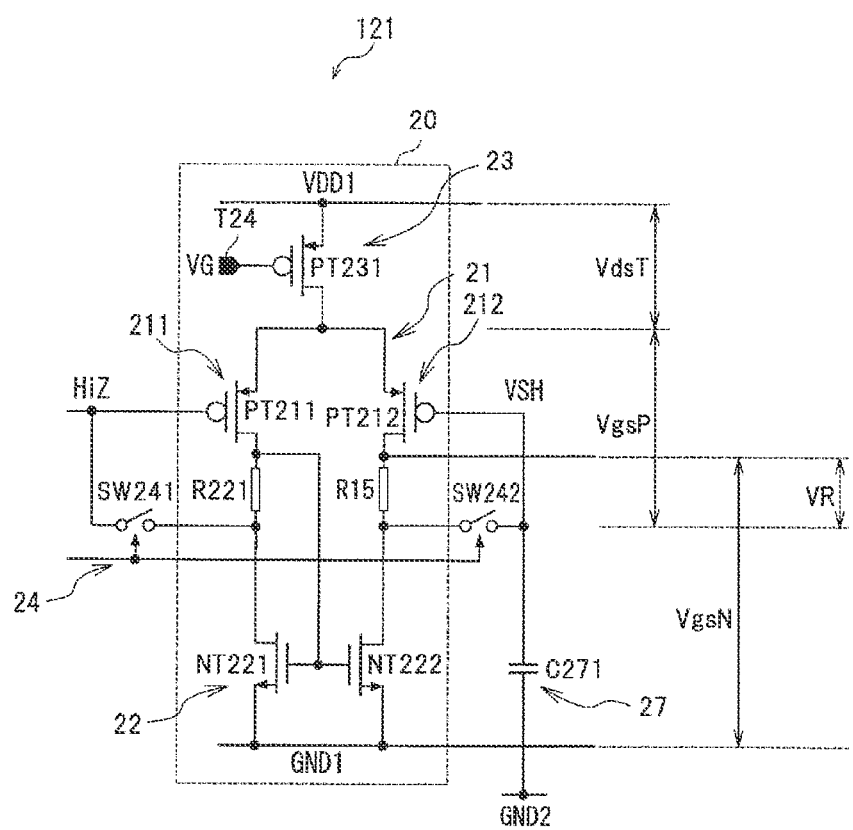
FIG. 5 is a diagram describing the lower limit value of the power source voltage at which the comparator provided on the image sensor according to the embodiment of the present technology is operable.

Now, the lower limit value of the power source VDD1 at which the comparator 121 (i.e., the differential amplifier 20) is operable will be described using FIG. 5 and FIG. 6. In FIG. 5, the differential amplifier 20, the switches SW241 and SW242, and a capacitor C271 provided in the comparator 121 are extracted and illustrated. Further, FIG. 5 illustrates the voltages applied to the tail current source 23, the differential input unit 21, and the current mirror unit 22 when the switch SW241 and the switch SW242 are in the on state.

The voltage value of the power source VDD1 required to operate the comparator 121 is maximized in the case where the switch SW241 and the switch SW242 are in the on state. For this reason, by lowering the voltage of the power source VDD1 in the case where the switch SW241 and the switch SW242 are in the on state, it is possible to reduce the power consumption of the ADC 105 and the power consumption of the image sensor 1. The power source VDD1 for operating the comparator 121 is divided and applied to the tail current source 23, the differential input unit 21, and the current mirror unit 22.

As shown in FIG. 5, the voltage applied to the tail current source 23 is a drain-source voltage VdsT of the PMOS transistor PT231 constituting the tail current source 23.

In the case where the switch SW241 is in the on state, the gate of the PMOS transistor PT211 of the differential input unit 21 is at the same potential as the different terminal of the first resistance element R221. For this reason, the voltage applied between the source of the PMOS transistor PT211 and the different terminal of the first resistance element R221 in the case where the switch SW241 is in the on state is equal to a gate-source voltage Vgs of the PMOS transistor PT211.

Further, in the case where the switch SW242 is in the on state, the gate of the PMOS transistor PT212 of the differential input unit 21 is at the same potential as the different terminal of the second resistance element R15. For this reason, the voltage applied between the source of the PMOS transistor PT212 and the different terminal of the second resistance element R15 in the case where the switch SW242 is in the on state is equal to a gate-source voltage Vgs of the PMOS transistor PT212.

As described above, the first resistance element R221 and the second resistance element R15 are formed so as to have substantially the same resistance values. Further, the PMOS transistor PT211 and the PMOS transistor PT212 are formed closely together with substantially the same transistor sizes. For this reason, the PMOS transistor PT211 and the PMOS transistor PT212 have substantially the same transistor characteristics. For this reason, in the case where the switch SW241 and the switch SW242 are in the on state, the gate-source voltage Vgs of the PMOS transistor PT211 and the gate-source voltage Vgs of the PMOS transistor PT212 have substantially the same voltage values. A gate-source voltage VgsP of each of the PMOS transistor PT211 and the PMOS transistor PT212 at the voltage values is the voltage to be applied to the differential input unit 21 in the case where the switch SW241 and the switch SW242 are in the on state.

The gate of the NMOS transistor NT221 of the current mirror unit 22 is connected to the one terminal of the first resistance element R221. For this reason, the gate of the NMOS transistor NT221 of the current mirror unit 22 is at the same potential as the one terminal of the first resistance element R221. Thus, the voltage applied between the source of the NMOS transistor NT221 and the one terminal of the first resistance element R221 is equal to a gate-source voltage Vgs of the NMOS transistor NT221.

The gate of the NMOS transistor NT222 of the current mirror unit 22 is connected to the one terminal of the first resistance element R221. For this reason, the gate of the NMOS transistor NT222 of the current mirror unit 22 is at the same potential as the one terminal of the first resistance element R221. Further, as described above, the first resistance element R221 and the second resistance element R15 have substantially the same resistance values. In addition, the PMOS transistor PT211 and the PMOS transistor PT212 have substantially the same transistor characteristics. For this reason, in the case where the switch SW241 and the switch SW242 are in the on state, the one terminal of the first resistance element R221 and the one terminal of the second resistance element R15 are at the same potential. Thus, the voltage applied between the source of the NMOS transistor NT222 and the one terminal of the second resistance element R15 is equal to a gate-source voltage Vgs of the NMOS transistor NT222.

The NMOS transistor NT221 and the NMOS transistor NT222 are formed closely together with substantially the same transistor sizes. For this reason, the NMOS transistor NT221 and the NMOS transistor NT222 have substantially the same transistor characteristics. For this reason, in the case where the switch SW241 and the switch SW242 are in the on state, the gate-source voltage Vgs of the NMOS transistor NT221 and the gate-source voltage Vgs of the NMOS transistor NT222 have substantially the same voltage values. A gate-source voltage VgsN of each of the NMOS transistor NT221 and the NMOS transistor NT222 at the voltage values is the voltage to be applied to the current mirror unit 22 in the case where the switch SW241 and the switch SW242 are in the on state.

As described above, in the case where the switch SW241 and the switch SW242 are in the on state, the gate-source voltage VgsP in the differential input unit 21 and the gate-source voltage VgsN in the current mirror unit 22 overlap by a potential difference that occurs between the terminals of the first resistance element R221 and the second resistance element R15, i.e., the terminal voltage VR. Here, reference symbols of the gate-source voltage VgsP in the differential input unit 21, the gate-source voltage VgsN in the current mirror unit 22, the terminal voltage VR between the first resistance element R221 and the second resistance element R15, the drain-source voltage VdsT in the tail current source 23, and the power source VDD1 will be used also as the reference symbols representing the respective voltage values. Then, the power source VDD1 in the case where the first resistance element R221 and the second resistance element R15 are provided in the comparator 121 and when the switch SW241 and the switch SW242 are in the on state can be expressed by the following formula (1).

$$VDD1 = VdsT + VgsP + VgsN - VR \qquad (1)$$

Now, the voltage value of the power source VDD1 of the comparator 121 in the case where the first resistance element R221 and the second resistance element R15 are not provided will be described using FIG. 6. FIG. 6 illustrates the comparator 121 as one Example in the case where the first resistance element R221 and the second resistance element R15 are not provided.

Figure 6:
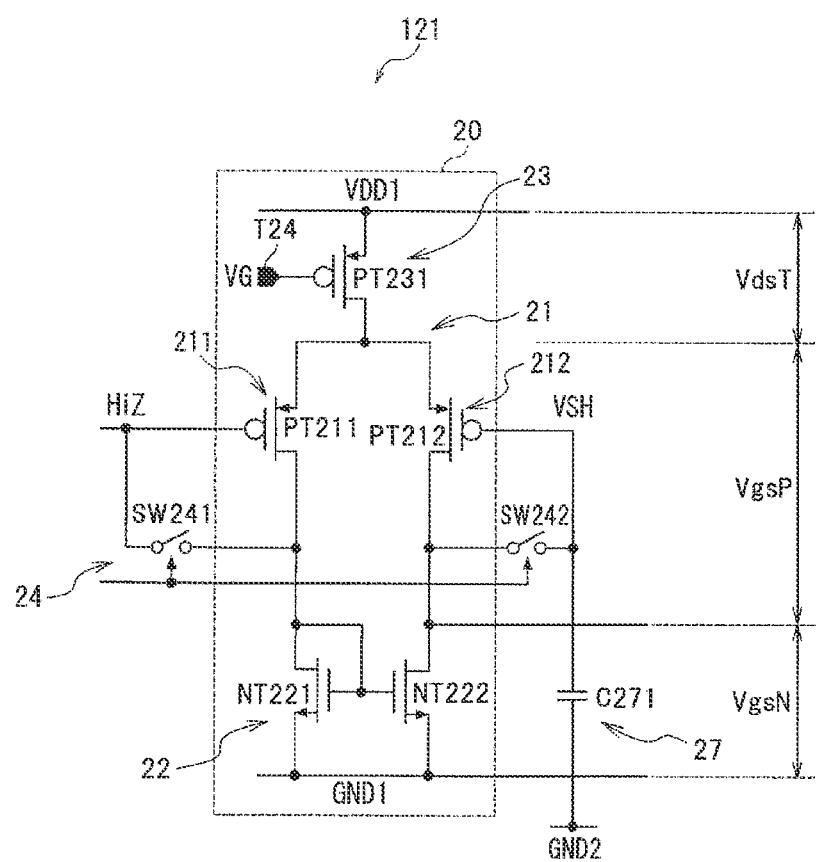
FIG. 6 is a diagram describing a comparator according to one Example provided in the image sensor according to the embodiment of the present technology, and is a diagram describing the lower limit value of the power source voltage at which a comparator according to one Example is operable.

As shown in FIG. 6, in the case where the first resistance element R221 and the second resistance element R15 are not provided, the drain of the PMOS transistor PT211 of the differential input unit 21, the drain of the NMOS transistor NT221 of the current mirror unit 22, and the different terminal of the switch SW241 are connected to each other. Further, in the case where the first resistance element R221 and the second resistance element R15 are not provided, the drain of the PMOS transistor PT212 of the differential input unit 21, the drain of the NMOS transistor NT222 of the current mirror unit 22, and the different terminal of the switch SW242 are connected to each other.

For this reason, in the case where the switch SW241 is in the on state, the gate of the PMOS transistor PT211 of the differential input unit 21 is at the same potential as the drain of the PMOS transistor PT211. For this reason, in the case where the switch SW241 is in the on state, the drain-source voltage Vds of the PMOS transistor PT211 is equal to the gate-source voltage Vgs of the PMOS transistor PT211.

Further, in the case where the switch SW242 is in the on state, the gate of the PMOS transistor PT212 of the differential input unit 21 is at the same potential as the drain of the PMOS transistor PT212. For this reason, in the case where the switch SW242 is in the on state, the drain-source voltage Vds of the PMOS transistor PT212 is equal to the gate-source voltage Vgs of the PMOS transistor PT212.

As described above, the PMOS transistor PT211 and the PMOS transistor PT212 have substantially the same transistor characteristics. For this reason, in the case where the switch SW241 and the switch SW242 are in the on state, the gate-source voltage Vgs of the PMOS transistor PT211 and the gate-source voltage Vgs of the PMOS transistor PT212 have substantially the same voltage values. The gate-source voltage VgsP of each of the PMOS transistor PT211 and the PMOS transistor PT212 at the voltage values is the voltage to be applied to the differential input unit 21 in the case where the switch SW241 and the switch SW242 are in the on state.

The gate of the NMOS transistor NT221 of the current mirror unit 22 is connected to the drain of the NMOS transistor NT221. For this reason, the gate of the NMOS transistor NT221 of the current mirror unit 22 is at the same potential as the drain of the NMOS transistor NT221. Thus, a drain-source voltage Vds of the NMOS transistor NT211 is equal to the gate-source voltage Vgs of the NMOS transistor NT221.

The gate of the NMOS transistor NT222 of the current mirror unit 22 is connected to the drain of the NMOS transistor NT221. For this reason, the gate of the NMOS transistor NT222 of the current mirror unit 22 is at the same potential as the drain of the NMOS transistor NT221. Further, as described above, the PMOS transistor PT211 and the PMOS transistor PT212 have substantially the same transistor characteristics. For this reason, in the case where the switch SW241 and the switch SW242 are in the on state, the drain of the PMOS transistor PT211 and the drain of the PMOS transistor PT212 have substantially the same potentials. Thus, a drain-source voltage Vds of the NMOS transistor NT222 is equal to the gate-source voltage Vgs of the NMOS transistor NT222.

The NMOS transistor NT221 and the NMOS transistor NT222 have substantially the same transistor characteristics. For this reason, in the case where the switch SW241 and the switch SW242 are in the on state, the gate-source voltage Vgs of the NMOS transistor NT221 and the gate-source voltage Vgs of the NMOS transistor NT222 have substantially the same voltage values. The gate-source voltage VgsN of each of the NMOS transistor NT221 and the NMOS transistor NT222 at the voltage values is the voltage to be applied to the current mirror unit 22 in the case where the switch SW241 and the switch SW242 are in the on state.

As described above, in the case where the first resistance element R221 and the second resistance element R15 are not provided, the voltage of the power source VDD1 is not applied to the differential input unit 21 and the current mirror unit 22 in an overlapping manner. For this reason, the power source VDD1 in the case where the first resistance element R221 and the second resistance element R15 are not provided in the comparator 121 and when the switch SW241 and the switch SW242 are in the on-state can be expressed by the following formula (2).

$$VDD1 = VdsT + VgsP + VgsN \qquad (2)$$

In this manner, the comparator 121 is operable at the power source VDD1 reduced by the terminal voltage VR between the first resistance element R221 and the second resistance element R15 as compared with the case where the first resistance element R221 and the second resistance element R15 are not provided. As a result, it is possible to reduce the power consumption of the image sensor 1 as well as the power consumption of the ADC 105.

As shown in the formula (1), the power source VDD1 can be set lower as the voltage value of the terminal voltage VR between the first resistance element R221 and the second resistance element R15 is larger. However, the larger the voltage value of the terminal voltage VR between the first resistance element R221 and the second resistance element R15, the lower the drain-source voltages Vds of the NMOS transistors NT221 and NT222 of the current mirror unit 22. When the drain-source voltages Vds of the NMOS transistors NT221 and NT222 of the current mirror unit 22 are low, the operating points of the NMOS transistors NT221 and NT222 of the current mirror unit 22 are each a linear region, and therefore, the comparator 121 is difficult to operate stably. For this reason, the resistance values of the first resistance element R221 and the second resistance element R15 are set so that the operating points of the NMOS transistors NT221 and NT222 of the current mirror unit 22 are in a saturated region.

Next, the area occupied by the first resistance element R221 and the second resistance element R15 in the region where the comparator 121 is formed will be described using FIG. 7. On the left side of FIG. 7, the region where the comparator 121 is formed in the case where the first resistance element R221 and the second resistance element R15 are provided is schematically shown. On the right side of FIG. 7, the region where the comparator 121 is formed in the case where the first resistance element R221 and the second resistance element R15 are not provided is schematically shown.

Figure 7:
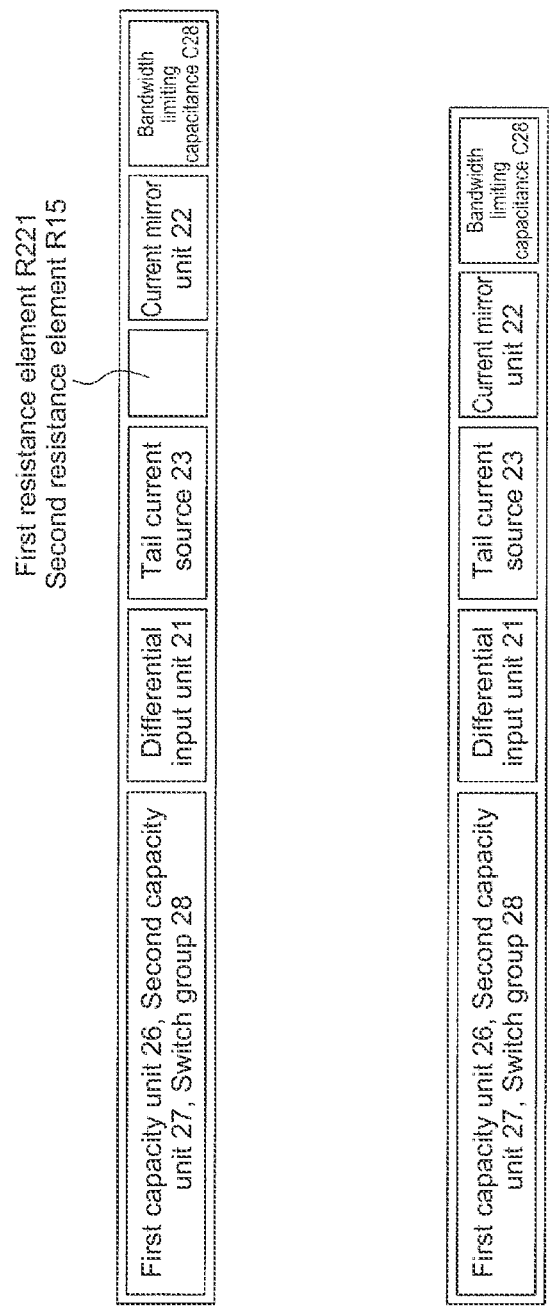
FIG. 7 is a diagram describing the image sensor according to the embodiment of the present technology, and is a diagram schematically showing the area occupied by a first resistance element and a second resistance element in the region where the comparator is formed.

As shown in FIG. 7, the area occupied by the first resistance element R221 and the second resistance element R15 in the region where the comparator 121 is formed is smaller than the area occupied by the first capacitance unit 26, the second capacitance unit 27, and a switch group 28 (described below in detail), the area occupied by the differential input unit 21, the area occupied by the tail current source 23, the area occupied by the current mirror unit 22, and the area occupied by a bandwidth limit capacitance C28 (described below in detail) in the formation region. For this reason, the region where the comparator 121 is formed does not differ greatly depending on the presence or absence of the first resistance element R221 and the second resistance element R15. Therefore, even if the comparator 121 includes the first resistance element R221 and the second resistance element R15, the comparator 121 can be disposed in the formation area of the ADC 105 without affecting the counter 122 and the latch 123 (see FIG. 2).

Figure 8:
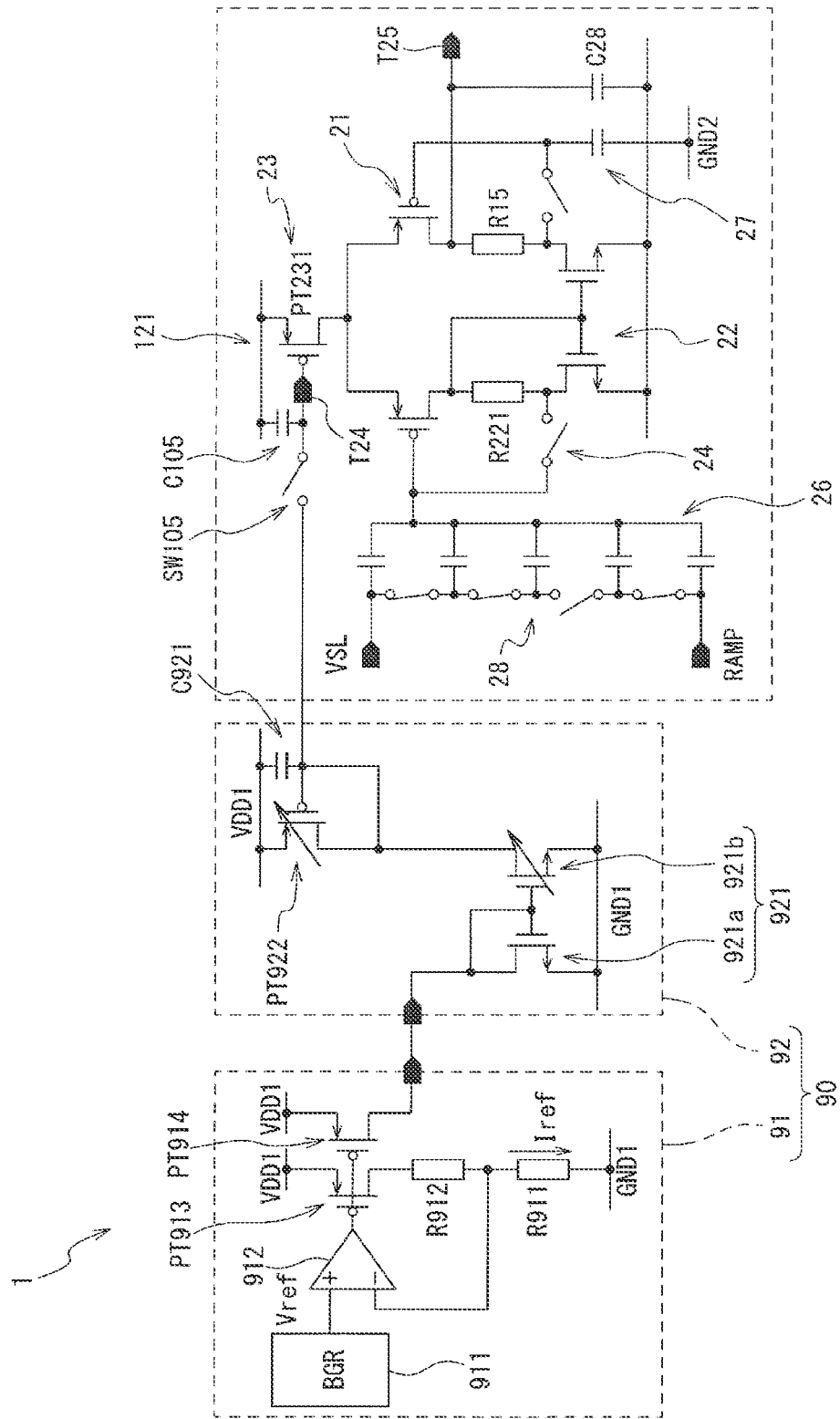
FIG. 8 is a diagram describing the image sensor according to the embodiment of the present technology, and is a diagram showing a circuit configuration of a current generation unit that generate a bias current.

Next, a current generation unit that generates a bias current for determining the operating point of the comparator 121 will be described using FIG. 8. In FIG. 8, the comparator 121 is also shown for ease of understanding.

As shown in FIG. 8, a current generation unit 90 includes a bias current generation circuit 91 and a comparator bias circuit 92. The bias current generation circuit 91 is configured to generate a reference current Iref that is a reference for the current to be supplied to the comparator 121. The comparator bias circuit 92 is configured to adjust the reference current Iref generated by the bias current generation circuit 91 so that a desired current flows through each of the plurality of comparators 121 provided in the ADC group 12.

The bias current generation circuit 91 includes a BGR (Band Gap Reference) circuit 911 that generate a reference voltage Vref and an amplifier 912 to which the reference voltage Vref is input. The amplifier 912 includes, for example, an operational amplifier. An output terminal of the BGR circuit 911 is connected to the non-inverting input terminal (+) of the amplifier 912. As a result, the reference voltage Vref generated by the BGR circuit 911 is input to the non-inverting input terminal (+) of the amplifier 912.

The bias current generation circuit 91 includes a PMOS transistor PT913 to which an output voltage of the amplifier 912 is input, and a reference resistance element R911 and a resistance element R912 connected in series between the PMOS transistor PT913 and the ground GND1. The reference resistance element R911 is an element of the same type as the first resistance element R221 and the second resistance element R15, the reference resistance element R911 determining a current value of the reference current Iref that is a reference of a bias current for determining the operating point of the comparator 121. At least a part of each of the reference resistance element R911, the first resistance element R221, and the second resistance element R15 may be formed of polysilicon. When at least a part of each of the reference resistance element R911, the first resistance element R221, and the second resistance element R15 is an element of the same type, the terminal voltage VR between the first resistance element R221 and the second resistance element R15 can be designed with high accuracy. The resistance value of each of the reference resistance element R911, the first resistance element R221, and the second resistance element R15 varies, for example, by ambient temperatures at which the image sensor 1 is used. When at least a part of each of the reference resistance element R911, the first resistance element R221, and the second resistance element R15 is an element of the same type, the resistance value of each of the reference resistance element R911, the first resistance element R221, and the second resistance element R15 varies due to the influences of ambient temperatures similarly. For example, when the resistance value of each of the first resistance element R221 and the second resistance element R15 increases due to the influences of ambient temperatures, the resistance value of the reference resistance element R911 also increases. Further, when the resistance value of each of the first resistance element R221 and the second resistance element R15 decreases due to the influences of ambient temperatures, the resistance value of the reference resistance element R911 also decreases. In this manner, the variation in the terminal voltage VR based on the variation in the resistance value of each of the first resistance element R221 and the second resistance element R15 is cancelled by the variation in the bias current based on the substantially constant reference voltage Vref and the variation in the resistance value of the reference resistance element R911. As a result, the accuracy of the terminal voltage VR between the first resistance element R221 and the second resistance element R15 can be improved, and the operation of the image sensor 1 can be stabilized.

An output terminal of the amplifier 912 is connected to a gate of the PMOS transistor PT913. A source of the PMOS transistor PT913 is connected to the power source VDD1. A drain of the PMOS transistor PT913 is connected to one terminal of the resistance element R912. A different terminal of the resistance element R912 is connected to one terminal of the reference resistance element R911. A different terminal of the reference resistance element R911 is connected to the ground GND1.

Further, the bias current generation circuit 91 includes a PMOS transistor PT914 for outputting the reference current Iref to the comparator bias circuit 92. The PMOS transistor PT913 and the PMOS transistor PT914 have substantially the same transistor characteristics. A gate of the PMOS transistor PT914 is connected to the gate of the PMOS transistor PT913. The source of the PMOS transistor PT913 is connected to the power source VDD1. A drain of the PMOS transistor PT914 is connected to the comparator bias circuit 92. Thus, the gate-source voltages of the PMOS transistor PT914 and the PMOS transistor PT913 have substantially the same voltage values. As a result, a drain-source current of substantially the same magnitude flows through the PMOS transistor PT914 and the PMOS transistor PT913.

The inverting input terminal (−) of the amplifier 912 is connected to the one terminal of the reference resistance element R911 and the different terminal of the resistance element R912. The amplifier 912 adjusts the voltage to be applied to the gate of the PMOS transistor PT913 so that a drain-source current substantially equal to the value obtained by dividing the reference voltage Vref to be input to the non-inverting input terminal (+) by the reference resistance element R911 flows through the PMOS transistor PT913. That is, the amplifier 912 feedback-controls the PMOS transistor PT913 so that the voltage to be input to the inverting input terminal (−) is at the same potential as the reference voltage Vref. As a result, the bias current generation circuit 91 is capable of outputting a constant current proportional to the value obtained by divining the reference voltage Vref by the reference resistance element R911 from the PMOS transistor PT914 to the comparator bias circuit 92.

As shown in FIG. 8, the comparator bias circuit 92 includes a current mirror circuit 921, a PMOS transistor PT922 connected to the current mirror circuit 921, and a capacitor C921 connected to a gate of the PMOS transistor PT922.

A current mirror circuit 921 includes an NMOS transistor NT921a connected to the bias current generation circuit 91, and an NMOS transistor NT921b whose gate is connected to a gate of the NMOS transistor 921a. A drain of the NMOS transistor NT921a is connected to the drain of the PMOS transistor PT914 of the bias current generation circuit 91. A source of the NMOS transistor NT921a is connected to the ground GND1. The gate of the NMOS transistor NT921a is connected to the drain of the NMOS transistor NT921a. For this reason, the NMOS transistor NT921a is in the state of being diode-connected. Further, the NMOS transistor NT921a is connected in series to the PMOS transistor PT914 between the power source VDD1 and the ground GND1. For this reason, a drain-source current having the same current value as that of the drain-source current of the PMOS transistor PT914 flows through the NMOS transistor NT921a.

A source of the NMOS transistor NT921b is connected to the ground GND1. A drain of the NMOS transistor NT921b is connected to a drain of the PMOS transistor PT922. Gates of the NMOS transistor NT921a and the NMOS transistor NT921b are connected to the drain of the NMOS transistor NT921a. As a result, a drain-source current proportional to a drain-source voltage of the NMOS transistor NT921a flows through the NMOS transistor NT921b. The NMOS transistor NT921b is configured to capable of changing the drain-source current. The drain-source voltage of the NMOS transistor NT921b is set to a current value that allows a desired current to flow through each of the plurality of comparators 121 provided in the ADC group 12.

A source of the PMOS transistor PT922 is connected to the power source VDD1. The PMOS transistor PT922 is configured to be capable of changing the drain-source current. One electrode of the capacitor C921 is connected to the power source VDD1. A different electrode of the capacitor C921 is connected to the gate of the PMOS transistor PT922. The PMOS transistor PT922 is connected in series to the NMOS transistor NT921b between the power source VDD1 and the ground GND1. The gate of the PMOS transistor PT922 is connected to the drain of the PMOS transistor PT922. As a result, the PMOS transistor PT922 is in the state of being diode-connected. For this reason, the gate voltage of the PMOS transistor PT922 is adjusted so that the drain-source current has the same current value as that of the drain-source current of the NMOS transistor NT921b.

The capacitor C921 plays a role of suppressing noise of circuits provided in a stage preceding the capacitor C921 by reducing the bandwidth of the gate node of the PMOS transistor PT922.

As shown in FIG. 8, a switch SW105 is provided between the gate of the PMOS transistor PT922 of the comparator bias circuit 92 and a gate of the tail current source 23 of the comparator 121. The switch SW105 is provided in each of the ADCs 105-1 to 105-n (see FIG. 2). One terminal of the switch SW105 is connected to the gate of the PMOS transistor PT922 and the different electrode of the capacitor C921. A different terminal of the switch SW105 is connected to the gate of the PMOS transistor PT231 constituting the tail current source 23 via the input terminal T24.

A capacitor C105 is provided between the different terminal of the switch SW105 and the tail current source 23. The capacitor C105 is provided in each of the ADCs 105-1 to 105-n (see FIG. 2). One electrode of the capacitor C105 is connected to the power source VDD1. A different electrode of the capacitor C105 is connected to the different terminal of the switch SW105. Further, the different electrode of the capacitor C105 is connected to the gate of the PMOS transistor PT231 constituting the tail current source 23 via the input terminal T24.

When the switch SW105 is turned on, the different electrode of the capacitor C105 and the gate of the PMOS transistor PT922 have the same potential. This allows the capacitor C105 to hold a voltage of the same voltage value as that of the gate-source voltage at which the PMOS transistor PT231 of the tail current source 23 is capable of causing a predetermined drain-source current to flow. This predetermined drain-source current is the desired current to be supplied to the comparator 121. Even if the switch SW105 is turned off after the different electrode of the capacitor C105 and the gate of the PMOS transistor PT922 have the same potential, the different electrode of the capacitor C105 maintains the same potential. The voltage maintained by the capacitor C105 is the bias voltage VG. As a result, the bias voltage VG is supplied to the tail current source 23 even after the switch SW105 is turned off, and a desired current continues to flow through the comparator 121. Since charges accumulated in the capacitor C105 discharge over time, there is a possibility that the bias voltage VG decreases. In this regard, the image sensor 1 is capable of maintaining the voltage of the capacitor C105 within a predetermined range by turning on the switch SW105 at predetermined timing. For this reason, since the variation in the bias voltage VG is suppressed within a predetermined range, the current to be supplied to the comparator 121 is maintained to be within a desired range. This prevents malfunction of the comparator 121.

With reference to FIG. 4 again, the comparator 121 includes the first capacitance unit 26 and the switch group 28 connected to the gate of the PMOS transistor PT211 of the differential input unit 21. The first capacitance unit 26 includes a capacitor C261 (example of a first capacitance) connected to the vertical signal line 110 (see FIG. 2) and a capacitor C262 (example of a second capacitance) connected to the DAC 104 (see FIG. 2) that generates the reference signal RAMP. Further, the comparator 121 includes a capacitance group 263 (example of a third capacitance) provided to be connectable to the capacitor C261 and the capacitor C262. The capacitance group 263 includes three split capacitors, i.e., a capacitor C263a, a capacitor C263b, and a capacitor C263c (example of a plurality of capacitances). The switch group 28 includes a switch SW281, a switch SW282, a switch SW283, and a switch SW284.

The switch SW281 is provided between the capacitor C261 and the capacitance group 263, and the switch SW282 is provided between the capacitor C262 and the capacitance group 263. The switches SW283 and SW284 are provided between the adjacent capacitors of the capacitor C263a, the capacitor C263b, and the capacitor C263c. More specifically, the switch SW283 is provided between the capacitor C263a and the capacitor C263b, and the switch SW284 is provided between the capacitor C263b and the capacitor C263c.

The capacitor C261 is connected between an input terminal T21 of the pixel signal VSL and the gate of the PMOS transistor PT211. The capacitor C261 is the input capacitance for the pixel signal VSL.

The capacitor C262 is connected between an input terminal T22 of the reference signal RAMP and the gate of the PMOS transistor PT211, and is the input capacitance for the reference signal RAMP.

The capacitor C263a, the capacitor C263b, and the capacitor C263c function as variable capacitors for changing the capacitance values of the capacitor C261 and the capacitor C262 in accordance with the on/off states of the switch SW281, the switch SW282, the switch SW283, and the switch SW284. The capacitor C263a, the capacitor C263b, and the capacitor C263c are connected between the input terminal T21 and the gate of the PMOS transistor PT211 via the switch SW281. Further, the capacitor C263a, the capacitor C263b, and the capacitor C263c are connected between the input terminal T22 and the gate of the PMOS transistor PT211 via the switch SW282.

More specifically, the capacitor C261 includes one electrode connected to the vertical signal line 110 (see FIG. 2) via the input terminal T21, and a different electrode connected to the gate of the PMOS transistor PT211 of the differential input unit 21. The capacitor C262 includes one electrode connected to the DAC 104 (see FIG. 2) via the input terminal T22, and a different electrode connected to the gate of the PMOS transistor PT211 of the differential input unit 21.

The switch group 28 provided in the comparator 121 includes a plurality of switches for switching between connection and disconnection of adjacent two capacitors of the capacitors C261, C262, C263a, C263b, and C263c. More specifically, the switch group 28 includes the switch SW281 for switching between connection and disconnection of the two adjacent capacitors, i.e., the capacitor C261 and the capacitor C263a. The switch group 28 includes the switch SW282 for switching between connection and disconnection of the two adjacent capacitors, i.e., the capacitor C262 and the capacitor C263c. The switch group 28 includes the switch SW283 for switching between connection and disconnection of the two adjacent capacitors, i.e., the capacitor C263a and the capacitor C263b. The switch group 28 includes the switch SW284 for switching between connection and disconnection of the two adjacent capacitors, i.e., the capacitor C263b and the capacitor C263c. The input terminal T21 is connected to one terminal of the switch SW281.

Each of the capacitors C261 to C263c includes one electrode connected to the switches SW281 to SW284, and a different electrode connected to the gate of the PMOS transistor PT211 of the differential input unit 21. More specifically, the capacitor C261 includes one electrode connected to the one terminal of the switch SW281, and a different electrode connected to the gate of the PMOS transistor PT211.

The capacitor C263a includes one electrode connected to a different terminal of the switch SW281 and one terminal of the switch SW283, and a different electrode connected to the gate of the PMOS transistor PT211. The capacitor C263b includes one electrode connected to a different terminal of the switch SW283 and one terminal of the switch SW284, and a different electrode connected to the gate of the PMOS transistor PT211. The capacitor C263c includes one electrode connected to a different terminal of the switch SW284 and one terminal of the switch SW282, and a different electrode connected to the gate of the PMOS transistor PT211. The input terminal T22 is connected to a different terminal of the switch SW282.

The capacitor C262 includes one electrode connected to a different terminal of the switch SW282, and a different electrode connected to the gate of the PMOS transistor PT211.

Therefore, the switches SW281 to SW284 are connected in series between the one electrode of the capacitor C261 and the one electrode of the capacitor C262.

By controlling the on/off states of the switches SW281 to SW284, the ratio of the input capacitance for the pixel signal VSL and the input capacitance for the reference signal RAMP is controlled. The switches SW281 to SW284 are controlled so that at least one of them is turned off.

Hereinafter, reference symbols of the capacitors C261 to C263c will be used also as the reference symbols representing the respective capacitance values. The capacitors C261 to C263c are connected in parallel. For this reason, an input attenuation gain Ainv for the pixel signal VSL can be expressed by the following formula (3), and an input attenuation gain Ainr for the reference signal RAMP can be expressed by the following formula (4).

$$Ainv=(C261+C\alpha)/\Sigma C \qquad (3)$$

$$Ainr=(C262+C\beta)/\Sigma C \qquad (4)$$

In the formula (3) and the formula (4), "$\Sigma C$" represents the total sum of capacitance values of the capacitors C261 to C263c. Further, "$C\alpha$" in the formula (3) represents the capacitance value of the capacitor added to the pixel signal VSL side in accordance with the on/off states of the switches SW281 to SW284. Further, "$C\beta$" in the formula (4) represents the capacitance value of the capacitor added to the reference signal RAMP side in accordance with the on/off states of the switches SW281 to SW284. "$C\alpha$" in the formula (3) and "$C\beta$" in the formula (4) are as follows in accordance with the on/off states of the switches SW281 to SW284.

(A) In the case where the switch SW281 is in the off state and the switches other than the switch SW281 are in the on state:

$$C\alpha=0$$

$$C\beta=C263a+C263b+C263c$$

(B) In the case where the switch SW283 is in the off state and the switches other than the switch SW283 are in the on state:

$$C\alpha=C263a$$

$$C\beta=C263b+C263c$$

(C) In the case where the switch SW284 is in the off state and the switches other than the switch SW284 are in the on state:

$$C\alpha=C263a+C263b$$

$$C\beta=C263c$$

(D) In the case where the switch SW282 is in the off state and the switches other than the switch SW282 are in the on state:

$$C\alpha=C263a+C263b+C263c$$

$$C\beta=0$$

In this manner, by switching the on/off states of the switches SW281 to SW284, the input capacitance for the pixel signal VSL and the input capacitance for the reference signal RAMP can be changed in a stepwise manner.

As shown in FIG. 4, the second capacitance unit 27 is connected to the second input unit 212 of the differential input unit 21. The second capacitance unit 27 includes the capacitor C271 (example of a fourth capacitance) connected to a ground GND2 (example of a supply unit of a reference potential). The capacitor C271 includes one electrode connected to the ground GND2 different from the ground GND1, and a different electrode connected to the gate of the PMOS transistor PT212 of the differential input unit 21 and the one terminal of the switch SW242. The current mirror unit 22 has a large current variation. For this reason, the current variation in the current mirror unit 22 is transmitted to a wiring resistance, and ground noise is generated in the ground GND1 connected to the current mirror unit 22. In this embodiment, one electrode of the capacitor C271 is connected to the ground GND2 different from the ground GND1 to which the current mirror unit 22 is connected. As a result, it is possible to prevent the capacitor C271 from being affected by the current variation of the current mirror unit 22. As a result, it is possible to stabilize the operation of the differential amplifier 20. Note that in the case where the ground GND1 has an area sufficient to absorb the affection of the current variation of the current mirror unit 22, the one electrode of the capacitor C271 may be connected to the ground GND1 instead of the ground GND2.

The comparator 121 includes the bandwidth limit capacitance C28 provided between the ground GND1 and the drain of the PMOS transistor PT212 of the differential input unit 21, the one terminal of the second resistance element R15, and the output terminal T25. One electrode of the bandwidth limit capacitance C28 is connected to the drain of the PMOS transistor PT212 of the differential input unit 21, the one terminal of the second resistance element R15, and the output terminal T25. A different electrode of the bandwidth limit capacitance C28 is connected to the ground GND1.

The amplitude ΔVSL of the voltage of the pixel signal VSL is ΔVSL×Ainv in the gate of the PMOS transistor PT211. Therefore, as the value of "Cα" in the formula (3) becomes smaller, the amplitude of the pixel signal VSL input to the differential amplifier 20 is attenuated. As a result, the input-referred noise is increased. Meanwhile, by increasing the ratio of the input capacitance of the pixel signal VSL to the input capacitance of the reference signal RAMP, i.e., by increasing "Cα" in the formula (3) and decreasing "Cβ" in the formula (4), it is possible to suppress the attenuation of the pixel signal VSL input to the differential amplifier 20 and suppress the input-referred noise.

However, when the ratio of the input capacitance of the pixel signal VSL to the input capacitance of the reference signal RAMP is increased, the attenuation amount of the reference signal RAMP input to the differential amplifier 20 increases conversely.

Figure 9:
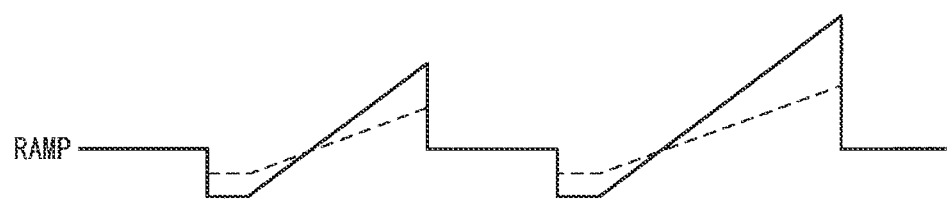
FIG. 9 is a diagram describing the comparator provided in the image sensor according to the embodiment of the present technology, and is a diagram for describing a change in a reference signal input to a differential amplifier by the ratio of an input capacitance.

FIG. 9 is a diagram comparing the reference signals RAMP input to the differential amplifier 20 in the case where the ratio of the input capacitance of the pixel signal VSL to the input capacitance of the reference signal RAMP is increased and decreased. The waveform indicated by the dotted line in FIG. 9 indicates the waveform of the reference signal RAMP input to the differential amplifier 20 in the case where the ratio is increased, and the waveform indicated by the solid line indicates the waveform of the reference signal RAMP input to the differential amplifier 20 in the case where the ratio is decreased.

As shown in FIG. 9, when the ratio of the input capacitance of the pixel signal VSL to the input capacitance of the reference signal RAMP is increased, the amplitude of the reference signal RAMP input to the differential amplifier 20 becomes smaller. As a result, the dynamic range of the ADC 105 is lowered.

Meanwhile, for example, by increasing the amplitude of the reference signal RAMP output from the DAC 104, it is conceivable to increase the amplitude of the reference signal RAMP input to the differential amplifier 20 to suppress a decrease in the dynamic range of the ADC 105.

However, the maximum value of the amplitude of the reference signal RAMP is limited by the specifications of the DAC 104 and the like. For example, in the high gain mode, since the amplitude of the reference signal RAMP is set to be small, the amplitude of the reference signal RAMP can be increased. Meanwhile, in the low gain mode, since the amplitude of the reference signal RAMP is set to be large in advance, it is difficult to further increase the amplitude of the reference signal RAMP in some cases.

Therefore, for example, in the high gain mode, the ratio of the input capacitance of the pixel signal VSL to the input capacitance of the reference signal RAMP is increased in a possible range, and the amplitude of the reference signal RAMP is increased. Thus, in the high gain mode susceptible to noise, it is possible to suppress the attenuation of the pixel signal VSL input to the differential amplifier 20, and suppress the influence of noise.

Meanwhile, for example, in the low gain mode, the input capacitance for the reference signal RAMP and the input capacitance for the pixel signal VSL only need to be set to values close to each other.

In the comparator 121, the connecting point of the gat of the PMOS transistor PT211, the capacitors C261 to C263c, and the switch SW241 is defined as a node HiZ. Further, in the comparator 121, the connecting point of the gate of the PMOS transistor PT212, the capacitor C271, and the switch SW242 is defined as a node VSH.

<Operation of Comparator>

Figure 10:
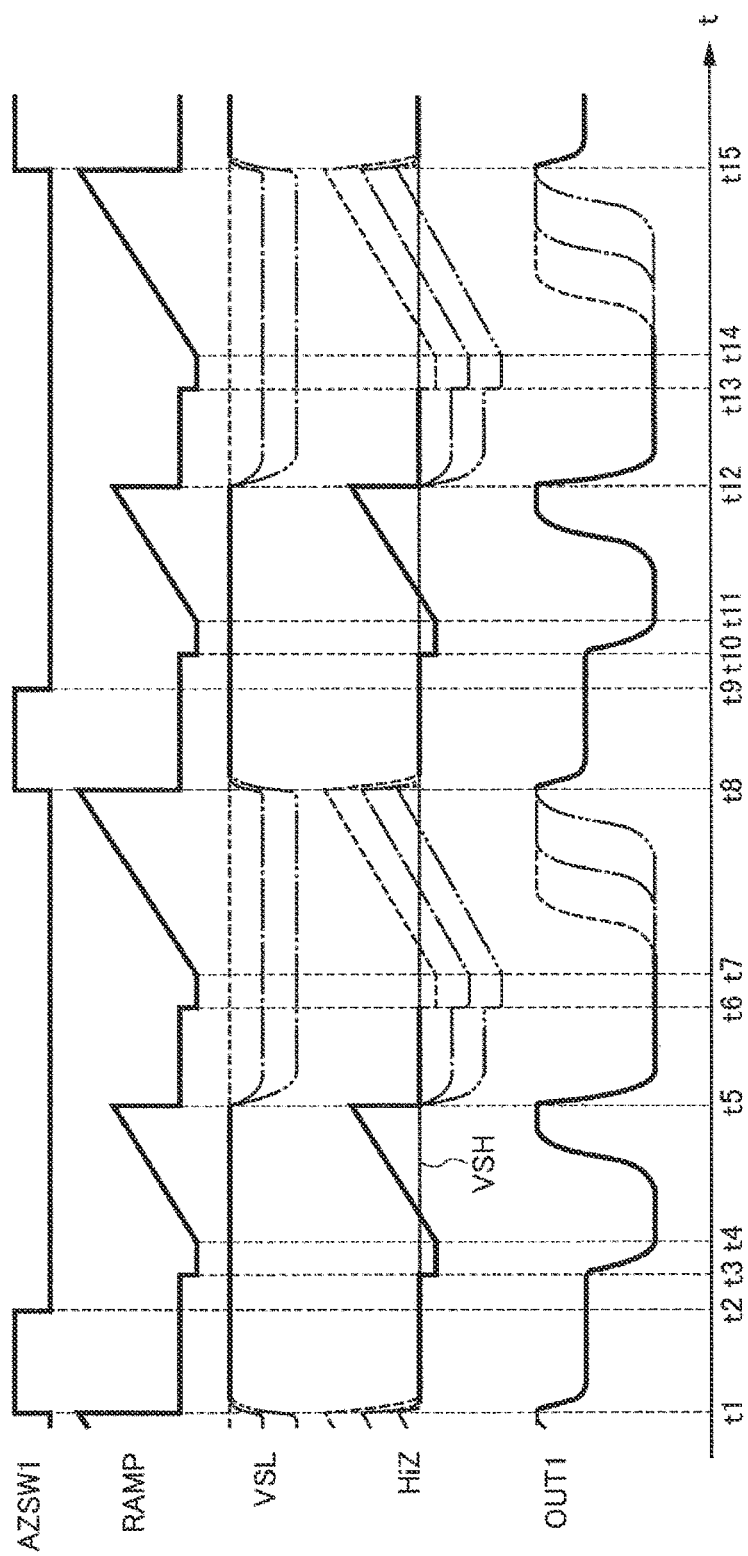
FIG. 10 is a timing chart for describing an operation of the comparator provided in the image sensor according to the embodiment of the present technology.
Figure 11:
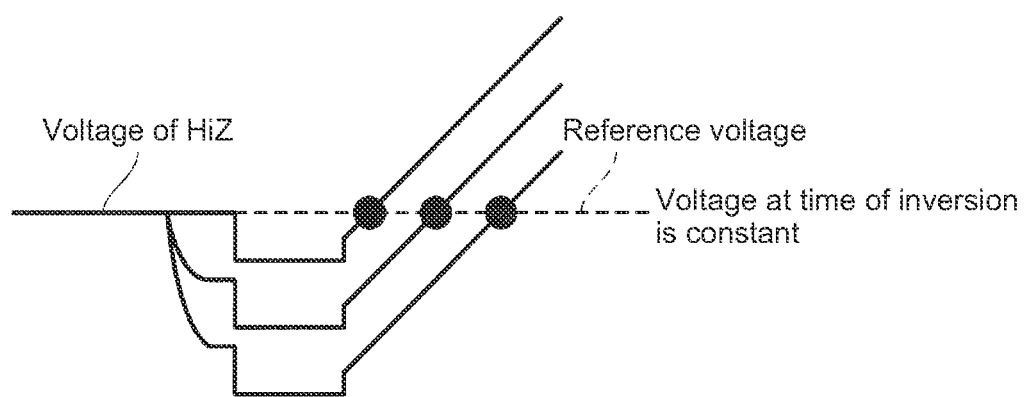
FIG. 11 is a diagram for describing the effects of the comparator provided in the image sensor according to the embodiment of the present technology.

Next, the operation of the comparator 121 will be described with reference to the timing charts of FIG. 10 and FIG. 11. FIG. 10 shows the timing chart of the drive signal AZSW1, the reference signal RAMP, the pixel signal VSL, the node VSH, the node HiZ, and the output signal OUT1. FIG. 11 shows an example of the waveform of the node HiZ from a time t5 to a time t8 shown in FIG. 10.

At a time t1, the drive signal AZSW1 is set to a high level. Although not shown, at substantially the same time as the drive signal AZSW1 is set to the high level, one switch of the switch SW281 to the switch SW284 is set to the off state, and the remaining switches are set to the on state on the basis of the gain at the time of imaging by the image sensor 1. In this embodiment, four gain modes can be supported. In the case of the gain mode of the lowest level, of the four gain modes, the switch SW281 is set to the off state. Further, in the case of the gain mode of the second lowest level, the switch SW283 is set to the off state. Further, in the case of the gain mode of the third lowest level, the switch SW284 is turned off. Further, in the case of the gain mode of the fourth lowest level, i.e., the highest level, the switch SW282 is set to the off state.

Then, the switch SW241 and the switch SW242 of the switch unit 24 are shifted from the off state to the on state, the gate of the PMOS transistor PT211 and the different terminal of the first resistance element R221 are connected to each other, and the gate of the PMOS transistor PT212 and the different terminal of the second resistance element R15 are connected to each other. Further, the reference signal RAMP is set to a predetermined reset level. Further, the FD 153 of the unit pixel P to be read is reset, and the pixel signal VSL is set to the reset level.

Thus, an auto-zero operation of the differential amplifier 20 is started. That is, the gate of the PMOS transistor PT211 and the different terminal of the first resistance element R221, and the gate of the PMOS transistor PT212 and the different terminal of the second resistance element R15 converge to the same predetermined voltage (hereinafter, referred to as the reference voltage). As a result, the voltages of the node HiZ and the node VSH are set to the reference voltage.

Next, at a time t2, the drive signal AZSW1 is set to the low level, and the switch SW241 and the switch SW242 are shifted from the on state to the off state. Thus, the auto-zero operation of the differential amplifier 20 is finished. The voltage of the node HiZ is held at the reference voltage because the pixel signal VSL and the reference signal RAMP do not change. Further, the voltage of the node VSH is maintained at the reference voltage by charges accumulated in the capacitor C271.

At a time t3, the voltage of the reference signal RAMP is lowered from the reset level by a predetermined value. As a result, the voltage of the node HiZ is lowered to be lower than the voltage (reference voltage) of the node VSH, and the output signal OUT1 of the differential amplifier 20 becomes a low level.

At a time t4, the reference signal RAMP begins to increase. Along with this, the voltage of the node HiZ also increases. Further, the counter 122 starts counting.

After that, when the voltage of the node HiZ exceeds the voltage (reference voltage) of the node VSH, the output signal OUT1 of the differential amplifier 20 is inverted and becomes a high level. Then, the count value of the counter 122 when the output signal OUT1 is inverted to the high level is held in the latch 123 as the value of the pixel signal VSL of the P phase (reset level).

At a time t5, the voltage of the reference signal RAMP is set to the reset voltage. Further, the transfer transistor 152 of the unit pixel P is turned on, charges accumulated in the photodiode 151 during the exposure are transferred to the FD 153, and the pixel signal VSL is set to the signal level. As a result, the voltage of the node HiZ is reduced by a value corresponding to the signal level to be below the voltage (reference voltage) of the node VSH, and the output signal OUT1 of the differential amplifier 20 is inverted to the low level.

At a time t6, similarly to the time t3, the voltage of the reference signal RAMP is lowered from the reset level by a predetermined value. As a result, the voltage of the node HiZ is further reduced.

At a time t7, the reference signal RAMP begins to increase, similarly to the time t4. Along with this, the voltage of the node HiZ increases linearly. Further, the counter 122 starts counting.

After that, when the voltage of the node HiZ exceeds the voltage (reference voltage) of the node VSH, the output signal OUT1 of the differential amplifier 20 is inverted and becomes a high level. Then, the count value of the counters 122 when the output signal OUT1 is inverted to the high level is held in the latch 123 as the value of the pixel signal VSL of the D phase (signal level). Further, the latch 123 performs correlated double sampling by taking the difference between the pixel signal VSL of the D phase and the pixel signal VSL of the P phase read between the time t4 and the time t5. In this manner, the pixel signal VSL is AD-converted.

After that, the same operation as that performed from the time t1 to the time t7 is repeated after the time t8. Even after the time t8, at substantially the same time as the drive signal AZSW1 is set to the high level, one switch of the switch SW281 to the switch SW284 is set to the off state, and the remaining switches are set to the on state on the basis of the gain at the time of imaging by the image sensor 1.

This lowers the voltage of the power source VDD1 and reduces the power consumption of the ADC group 12. As a result, it is possible to reduce the power consumption of the image sensor 1.

In the existing comparator in which an image signal is input to one of a differential pair of a differential amplifier and a reference signal is input to the other of the differential pair, a reference signal and a pixel signal are compared, and the comparison result is output as an output signal. At this time, the input voltage (voltages of the reference signal and the pixel signal) of the differential amplifier at the time of inversion of the output signal varies depending on the voltage of the pixel signal. Therefore, for example, when the voltage of the power source for driving the comparator according to the existing technology is lowered, there is a possibility that the input voltage of the differential amplifier at the time of inversion of the output signal exceeds the input dynamic range of the comparator and the linearity of the AD conversion cannot be ensured.

In contrast, in the comparators 121 according to this embodiment, the comparison result between the voltage (voltage of the node HiZ) of the signal obtained by adding the pixel signal VSL and the reference signal RAMP via the input capacitance and the voltage (reference voltage) of the node VSH is output as the output signal OUT1 as described above. At this time, as shown in FIG. 11, the input voltage (voltages of the node HiZ and the node VSH) of the differential amplifier 20 at the time of inversion of the output signal OUT1 is constant without variation.

Further, in the image sensor 1, the direction in which the reference signal RAMP changes is opposite to the reference signal of the comparator according to the existing technology and changes in the direction opposite to the pixel signal VSL. Here, changing in the direction opposite to the pixel signal VSL means changing in the direction opposite to the direction in which the pixel signal VSL changes as the signal components increase. For example, in this example, the pixel signal VSL changes in the negative direction as the signal components increase, while the reference signal RAMP changes in the positive direction opposite thereto. Therefore, the voltage of the node HiZ (input voltage of the differential amplifier 20) is a voltage corresponding to the difference between the pixel signal VSL and the reference signal of the existing technology.

Thus, since the input voltage of the differential amplifier 20 at the time of inversion of the output signal OUT1 become constant, the input dynamic range of the differential amplifier 20 can be narrowed.

Therefore, the voltage of the power source VDD1 for driving the comparator 121 can be reduced below that of the comparator according to the existing technology, resulting in a reduction in the power consumption of the ADC group 12 and a reduction in the power consumption of the image sensor 1.

In addition, the image sensor 1 is capable of reducing the voltage value of the power source VDD1 during the auto-zero operation of the differential amplifier 20 as compared with the case where the first resistance element R221 and the second resistance element R15 are not provided. As a result, the image sensor 1 is capable of reducing the power consumption.

Modified Example of this Embodiment

Figure 12:
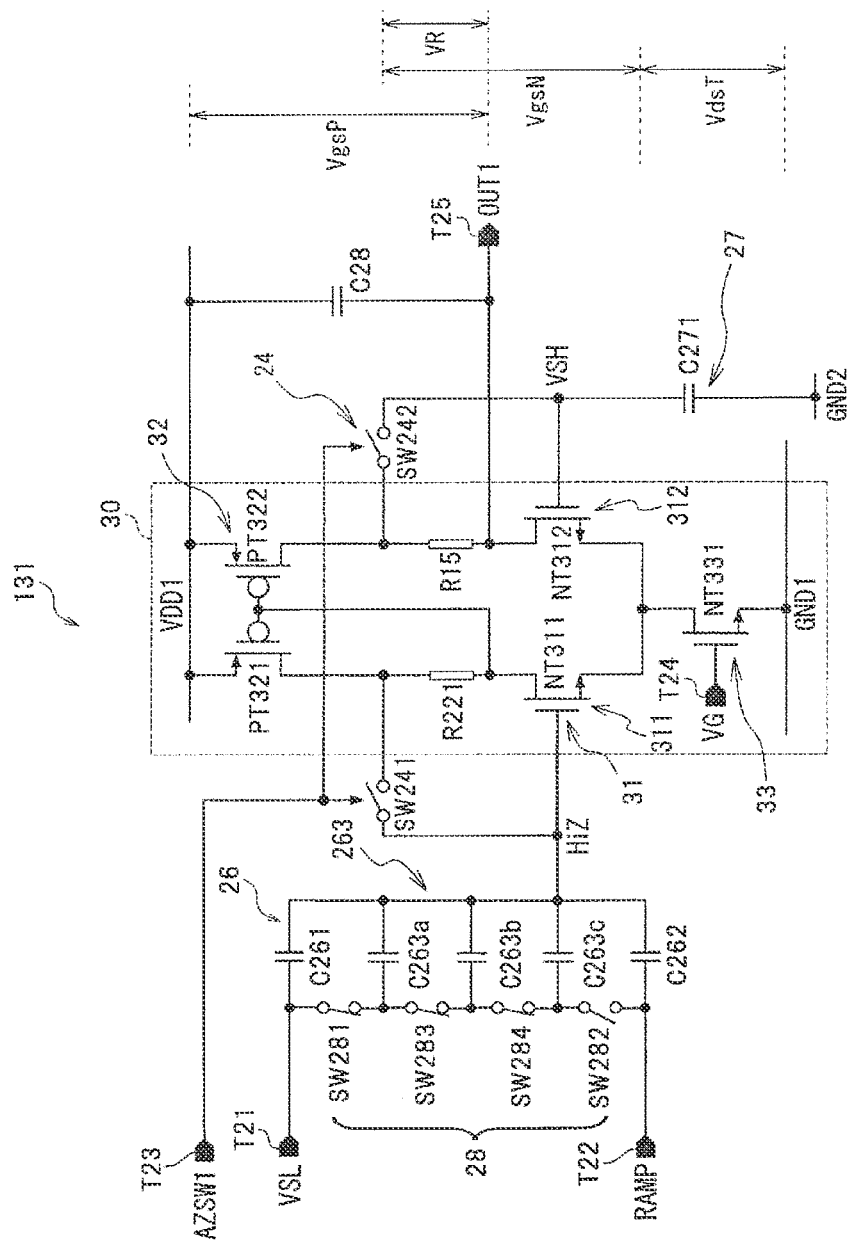
FIG. 12 is a circuit diagram showing a configuration example of a comparator provided in an image sensor according to a modified example 1 of the embodiment of the present technology.
Figure 13:
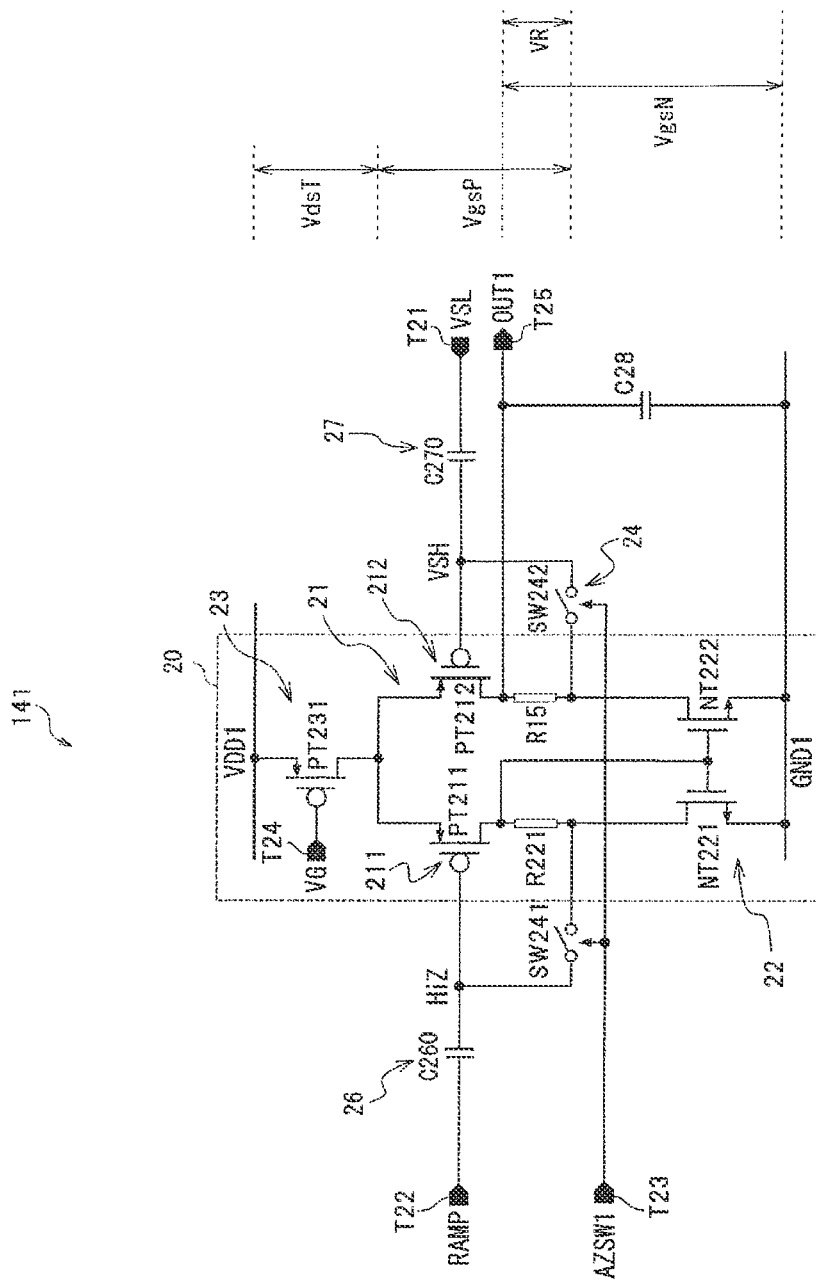
FIG. 13 is a circuit diagram showing a configuration example of a comparator provided in an image sensor according to a modified example 2 of the embodiment of the present technology.
Figure 14:
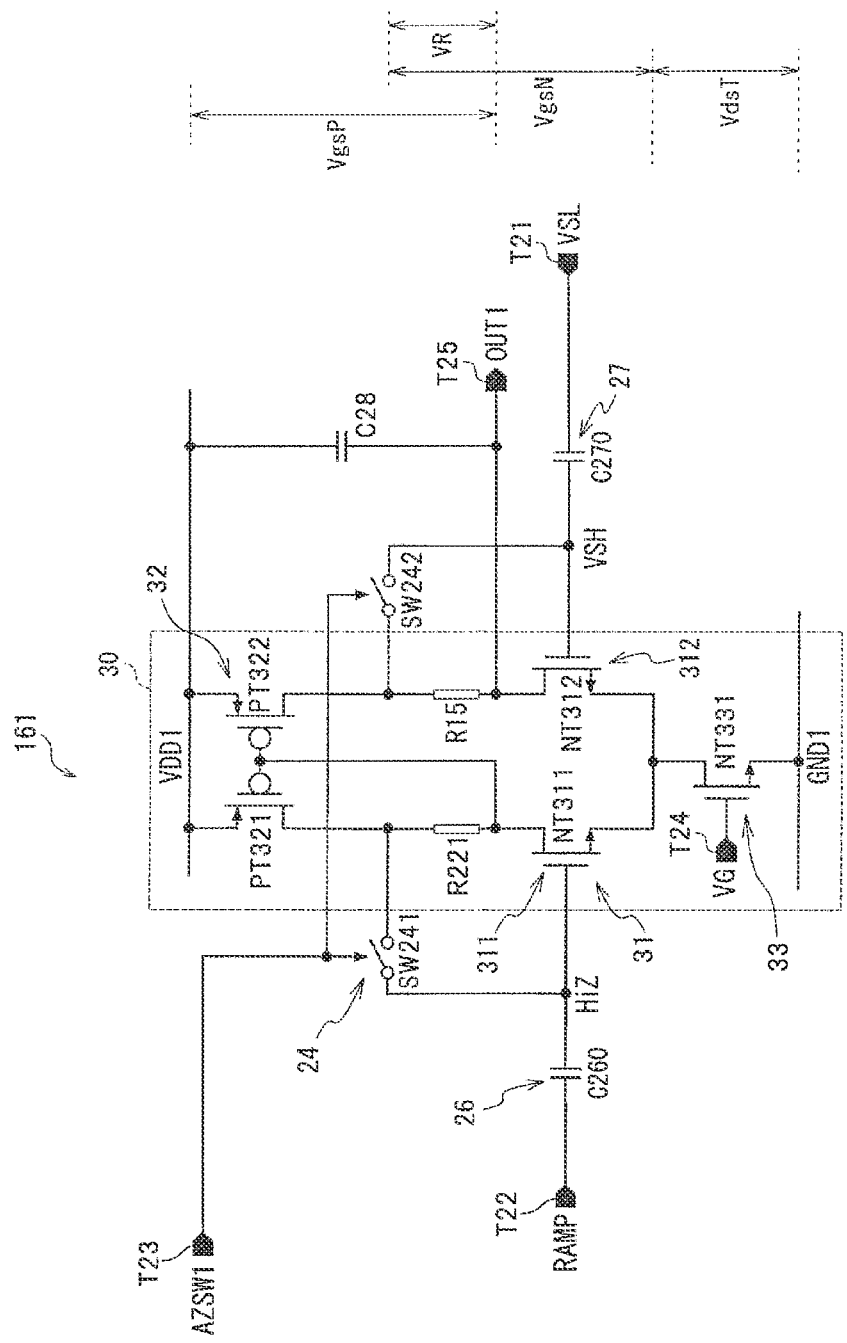
FIG. 14 is a circuit diagram showing a configuration example of a comparator provided in an image sensor according to a modified example 3 of the embodiment of the present technology.

Next, an image sensor according to a modified example of this embodiment will be described using FIG. 12 to FIG. 14. Further, FIG. 12 to FIG. 14 illustrate the voltage to be applied to a tail current source, a differential input unit, and a current mirror unit in the case where the switch SW241 and the switch SW242 are in the on state. Note that in the description of the modified example, components exhibiting the same effects and functions as those in the above-mentioned embodiment are denoted by the same reference symbols, and description thereof is omitted. Further, the entire configuration of the image sensor according to the modified example of this embodiment is similar to that of the image sensor 1 shown in FIG. 2. For this reason, the entire configuration of the image sensor according to the modified example of this embodiment will be described using the reference symbols shown in FIG. 2 as necessary.

Modified Example 1

An image sensor according to a modified example 1 is characterized in that the differential input unit and the tail current source each include an NMOS transistor and the current mirror unit includes a PMOS transistor.

As shown in FIG. 12, a comparator 131 according to this modified example is different from the comparator 121 in that a differential amplifier 30 is provided instead of the differential amplifier 20.

As shown in FIG. 12, the comparator 131 includes a first input unit 311 connected to the vertical signal line 110 (not shown in FIG. 4, see FIG. 2) via the first capacitance unit 26, and a differential input unit 31 that includes a second input unit 312 connected to the second capacitance unit 27. Further, the comparator 131 includes a current mirror unit 32 that includes a transistor diode-connected via the first resistance element R221. As will be described below in detail, the transistor is a PMOS transistor PT321. Further, the comparator 131 includes the second resistance element R15 connected to the differential input unit 31. Further, the comparator 131 includes the switch unit 24 provided between the first input unit 311 and a junction between the first resistance element R221 and the transistor (i.e., the PMOS transistor PT321), and between the second input unit 312 and a junction between the second resistance element R15 and the current mirror unit 32.

The first resistance element R221 and the second resistance element R15 according to this modified example have the same configuration and exhibit the same function as those of the first resistance element R221 and the second resistance element R15 provided in the comparator 121 according to the above-mentioned embodiment.

The comparator 131 includes a tail current source 33 connected to the differential input unit 31. The tail current source 33 includes an NMOS transistor NT331. The differential input unit 31, the current mirror unit 32, and the tail current source 33 constitute the differential amplifier 30.

The differential input unit 31 includes an NMOS transistor NT311 (example of a first transistor) that constitutes the first input unit 311, and an NMOS transistor NT312 (example of a second transistor) that constitutes the second input unit 312. The current mirror unit 32 includes the PMOS transistor PT321 (example of a third transistor) that is a transistor diode-connected via the first resistance element R221, and a PMOS transistor PT322 (example of a fourth transistor) connected to the second resistance element R15.

The switch unit 24 includes the switch SW241 (example of a first switch) provided between a junction between the NMOS transistor NT311 and the first capacitance unit 26 and a junction between the first resistance element R221 and the PMOS transistor PT321. Further, the switch unit 24 includes the switch SW242 (example of a second switch) provided between a junction between the NMOS transistor NT312 and the second capacitance unit 27 and a junction between the second resistance element R15 and the PMOS transistor PT322.

The one terminal of the first resistance element R221 is connected to a drain of the NMOS transistor NT311 of the differential input unit 31, a gate of the PMOS transistor PT321 of the current mirror unit 32, and a gate of the PMOS transistor PT322. Further, the different terminal of the first resistance element R221 is connected to a drain of the PMOS transistor PT321 and the switch SW241. The one terminal of the second resistance element R15 is connected to a drain of the NMOS transistor NT312. The different terminal of the second resistance element R15 is connected to a drain of the PMOS transistor PT322 and the switch SW242.

A source of the NMOS transistor NT311 is connected to a source of the NMOS transistor NT312 and a drain of the NMOS transistor NT331 of the tail current source 33. A gate of the NMOS transistor NT311 is connected to the first capacitance unit 26. A gate of the NMOS transistor NT312 is connected to the second capacitance unit 27.

A source of the PMOS transistor PT321 and a source of the PMOS transistor PT322 of the current mirror unit 32 are connected to the power source VDD1.

A source of the NMOS transistor NT331 is connected to the ground GND1. A gate of the NMOS transistor NT331 is connected to the input terminal T24 to which the bias voltage VG is input.

The junction between the NMOS transistor NT312 and the second resistance element R15 is connected to the output terminal T25 from which the output signal OUT1 is output. More specifically, the output terminal T25 is connected to the drain of the NMOS transistor NT312 and the one terminal of the second resistance element R15.

In the current mirror unit 32, the PMOS transistor PT321, the PMOS transistor PT322, and the first resistance element R221 constitute a current mirror circuit. Further, the differential input unit 31 and the tail current source 33 constitute a differential comparator. In other words, the NMOS transistor NT311, the NMOS transistor NT312, and the NMOS transistor NT331 constitute a differential comparator. The NMOS transistor NT331 operates as a current source by the bias voltage VG input from the outside via the input terminal T24, and the NMOS transistor NT311 and the NMOS transistor NT312 operate as differential transistors.

As shown in FIG. 12, the switch SW241 is connected between the drain-gate of the NMOS transistor NT311 via the first resistance element R221. More specifically, the one terminal of the switch SW241 is connected to the gate of the NMOS transistor NT311. The different terminal of the switch SW241 is connected to the different terminal of the first resistance element R221. Further, the different terminal of the switch SW241 is connected also to the drain of the PMOS transistor PT321. The one terminal of the first resistance element R221 is connected to the drain of the NMOS transistor NT311. Therefore, the switch SW241 is connected to the drain-gate of the NMOS transistor NT311 via the first resistance element R221. Further, in other words, the switch SW241 and the first resistance element R221 are connected in series between the drain-gate of the NMOS transistor NT311. The switch SW241 is switched from the on state to the off state or from the off state to the on state by the drive signal AZSW1 input from the timing control circuit 102 (see FIG. 2) via the input terminal T23. In the case where the switch SW241 is in the on state, the drain-gate of the NMOS transistor NT311 are connected to each other via the switch SW241 and the first resistance element R221. For this reason, in the case where the switch SW241 is in the on state, the NMOS transistor NT311 is in the state of being diode-connected via the switch SW241 and the first resistance element R221.

The switch SW242 is connected between the drain-gate of the NMOS transistor NT312 via the second resistance element R15. More specifically, the one terminal of the switch SW242 is connected to the gate of the NMOS transistor NT312. The different terminal of the switch SW242 is connected to the different terminal of the second resistance element R15. Further, the different terminal of the switch SW242 is connected to the drain of the PMOS transistor PT322. The one terminal of the second resistance element R15 is connected to the drain of the NMOS transistor NT312. Therefore, the switch SW242 is connected between the drain-gate of the NMOS transistor NT312 via the second resistance element R15. Further, in other words, the switch SW242 and the second resistance element R15 are connected in series between the drain-gate of the NMOS transistor NT312. The switch SW242 is switched from the on state to the off state or from the off state to the on state by the drive signal AZSW1 input from the timing control circuit 102 (see FIG. 2) via the input terminal T23. In the case where the switch SW242 is in the on state, the drain-gate of the NMOS transistor NT312 are connected to each other via the switch SW242 and the second resistance element R15. For this reason, in the case where the switch SW242 is in the on state, the NMOS transistor NT312 is in the state of being diode-connected via the switch SW242 and the second resistance element R15.

Now, the lower limit value of the power source VDD1 at which the comparator 131 (i.e., the differential amplifier 30) is operable will be described. Also in this modified example, the first resistance element R221 and the second resistance element R15 have substantially the same resistance values. Further, the NMOS transistor NT311 and the NMOS transistor NT312 that constitute the differential input unit 31 have the same transistor characteristics. Further, the PMOS transistor PT321 and the PMOS transistor PT322 constituting the current mirror unit 32 have the same transistor characteristics.

For this reason, in the case where the switch SW241 and the switch SW242 are in the on state, the voltage between the source of the NMOS transistor NT311 of the differential input unit 31 and the different terminal of the first resistance element R221 is equal to a gate-source voltage Vgs of the NMOS transistor NT311. Further, in the case where the switch SW241 and the switch SW242 are in the on state, the voltage between the source of the NMOS transistor NT312 of the differential input unit 31 and the different terminal of the second resistance element R15 is equal to a gate-source voltage Vgs of the NMOS transistor NT312. Further, the gate-source voltage Vgs of the NMOS transistor NT311 and the gate-source voltage Vgs of the NMOS transistor NT312 in the case where the switch SW241 and the switch SW242 are in the on-state have substantially the same voltage values. As shown in FIG. 12, the gate-source voltage VgsN of each of the NMOS transistor NT311 and the NMOS transistor NT312 at the voltage values is the voltage to be applied to the differential input unit 31 in the case where the switch SW241 and the switch SW242 are in the on state.

In the case where the switch SW241 and the switch SW242 are in the on state, the voltage between the source of the PMOS transistor PT321 of the current mirror unit 32 and the one terminal of the first resistance element R221 is equal to a gate-source voltage Vgs of the PMOS transistor PT321. Further, in the case where the switch SW241 and the switch SW242 are in the on state, the voltage between the source of the PMOS transistor PT322 of the current mirror unit 32 and the one terminal of the second resistance element R15 is equal to a gate-source voltage Vgs of the PMOS transistor PT322. Further, the gate-source voltage Vgs of the PMOS transistor PT321 and the gate-source voltage Vgs of the PMOS transistor PT322 in the case where the switch SW241 and the switch SW242 are in the on-state have substantially the same voltage values.

As shown in FIG. 12, the gate-source voltage VgsP of each of the PMOS transistor PT321 and the PMOS transistor PT322 at the voltage values is the voltage to be applied to the current mirror unit 32 in the case where the switch SW241 and the switch SW242 are in the on state.

As shown in FIG. 12, in the case where the switch SW241 and the switch SW242 are in the on state, the gate-source voltage VgsN in the differential input unit 31 and the gate-source voltage VgsP in the current mirror unit 32 overlap by a potential difference that occurs between the terminals of the first resistance element R221 and the second resistance element R15, i.e., the terminal voltage VR. Further, the voltage applied to the tail current source 33 is the drain-source voltage VdsT of the NMOS transistor NT331 constituting the tail current source 33. For this reason, the power source VDD1 in the case where the first resistance element R221 and the second resistance element R15 are provided in the comparator 131 according to this modified example and when the switch SW241 and the switch SW242 are in the on-state can be expressed by the above-mentioned formula (1).

Thus, the comparator 131 is operable at the power source VDD1 reduced by the terminal voltage VR between the first resistance element R221 and the second resistance element R15 as compared with the case where the first resistance element R221 and the second resistance element R15 are not provided. As a result, in accordance with this modified example, it is possible to reduce the power consumption of the image sensor 1 as well as the power consumption of the ADC 105.

Second Modified Example 2

An image sensor according to a modified example 2 is characterized in that the configurations of the first capacitance unit and the second capacitance unit are different from those in the image sensor according to the above-mentioned embodiment.

As shown in FIG. 13, a comparator 141 according to this modified example includes the differential amplifier 20 having the same configuration as that of the differential amplifier 20 provided in the comparator 121 according to the above-mentioned embodiment. Further, the comparator 141 includes the switch unit 24 having the same configuration as that of the switch unit 24 provided in the comparator 121.

Meanwhile, the comparator 141 includes the first capacitance unit 26 and the second capacitance unit 27 having configurations different from those of the first capacitance unit 26 and the second capacitance unit 27 provided in the comparator 121 according to the above-mentioned embodiment.

The first capacitance unit 26 is connected to the input terminal T22 to which the reference signal RAMP is input. More specifically, the first capacitance unit 26 includes a capacitor C260 provided between the input terminal T22 to which the reference signal RAMP is input and the first input unit 211 of the differential input unit 21. One electrode of the capacitor C260 is connected to the gate of the PMOS transistor PT211 that constitutes the first input unit 211, and the one terminal of the switch SW241. A different electrode of the capacitor C260 is connected to the input terminal T22. The capacitor C260 is the input capacitance for the reference signal RAMP.

The second capacitance unit 27 is connected to the vertical signal line 110 (see FIG. 2) to which the pixel signal VSL is supplied. More specifically, the second capacitance unit 27 includes a capacitor C270 provided between the input terminal T21 to which the pixel signal VSL is input and the second input unit 212 of the differential input unit 21. One electrode of the capacitor C270 is connected to the gate of the PMOS transistor PT212 that constitutes the second input unit 212, and the one terminal of the switch SW242. A different electrode of the capacitor C270 is connected to the input terminal T21. The capacitor C270 is the input capacitance for the pixel signal VSL.

In the comparator 141 according to this modified example, the connecting point of the gate of the PMOS transistor PT211, the capacitor C260, and the switch SW241 is the node HiZ. Further, in the comparator 141, the connecting point of the gate of the PMOS transistor PT212, the capacitor C270, and the switch SW242 is the node VSH.

The comparator 141 includes the differential amplifier 20 and the switch unit 24 having the same configurations as those of the comparator 121. For this reason, as shown in FIG. 13, in the case where the switch SW241 and the switch SW242 are in the on state, the voltage applied to the differential input unit 21, the current mirror unit 22, the tail current source 23, the first resistance element R221, and the second resistance element R15 can be expressed by the above-mentioned formula (1).

Thus, the comparator 141 is operable at the power source VDD1 reduced by the terminal voltage VR between the first resistance element R221 and the second resistance element R15 as compared with the case where the first resistance element R221 and the second resistance element R15 are not provided. As a result, in accordance with this modified example, it is possible to reduce the power consumption of the image sensor 1 as well as the power consumption of the ADC 105

Modified Example 3

An image sensor according to a modified example 3 is characterized in that the configurations of the first capacitance unit and the second capacitance unit are different from those of the image sensor according to the above-mentioned modified example 1.

As shown in FIG. 14, a comparator 161 according to this modified example includes the differential amplifier 30 having the same configuration as that of the differential amplifier 30 provided in the comparator 131 according to the above-mentioned modified example 1. Further, the comparator 161 includes the switch unit 24 having the same configuration as that of the switch unit 24 provided in the comparator 131. Meanwhile, the comparator 161 includes the first capacitance unit 26 and the second capacitance unit 27 having configurations different from those of the first capacitance unit 26 and the second capacitance unit 27 provided in the comparator 131 according to the above-mentioned modified example 1. The comparator 161 includes the first capacitance unit 26 and the second capacitance unit 27 having the same configurations as those of the first capacitance unit 26 and the second capacitance unit 27 provided in the comparator 141 according to the above-mentioned modified example 2.

The first capacitance unit 26 is connected to the input terminal T22 to which the reference signal RAMP is input. More specifically, the first capacitance unit 26 includes the capacitor C260 provided between the input terminal T22 to which the reference signal RAMP is input and the first input unit 311 of the differential input unit 31. The one electrode of the capacitor C260 is connected to the gate of the NMOS transistor NT311 constituting the first input unit 311 and the one terminal of the switch SW241. The different electrode of the capacitor C260 is connected to the input terminal T22. The capacitor C260 is the input capacitance for the reference signal RAMP.

The second capacitance unit 27 is connected to the vertical signal line 110 (see FIG. 2) to which the pixel signal VSL is supplied. More specifically, the second capacitance unit 27 includes the capacitor C270 provided between the input terminal T21 to which the pixel signal VSL is input and the second input unit 312 of the differential input unit 31. The one electrode of the capacitor C270 is connected to the gate of the NMOS transistor NT312 constituting the second input unit 312 and the one terminal of the switch SW242. The different electrode of the capacitor C270 is connected to the input terminal T21. The capacitor C270 is the input capacitance for the pixel signal VSL.

In the comparator 161 according to this modified example, the connecting point of the gate of the NMOS transistor NT311, the capacitor C260, and the switch SW241 is the node HiZ. Further, in the comparator 161, the connecting point of the gate of the NMOS transistor NT312, the capacitor C270, and the switch SW242 is the node VSH.

The comparator 161 includes the differential amplifier 30 and the switch unit 24 having the same configurations as those of the comparator 131. For this reason, as shown in FIG. 14, in the case where the switch SW241 and the switch SW242 are in the on state, the voltage applied to the differential input unit 31, the current mirror unit 32, the tail current source 33, the first resistance element R221, and the second resistance element R15 can be expressed by the above-mentioned formula (1).

Thus, the comparator 161 is operable at the power source VDD1 reduced by the terminal voltage VR between the first resistance element R221 and the second resistance element R15 as compared with the case where the first resistance element R221 and the second resistance element R15 are not provided. As a result, in accordance with this modified example, it is possible to reduce the power consumption of the image sensor 1 as well as the power consumption of the ADC 105.

<Configuration Example in Case where Image Sensor Includes Semiconductor Chip>

Next, a configuration example in the case where an image sensor includes a semiconductor chip will be described using FIG. 15 and FIG. 16.

Figure 15:
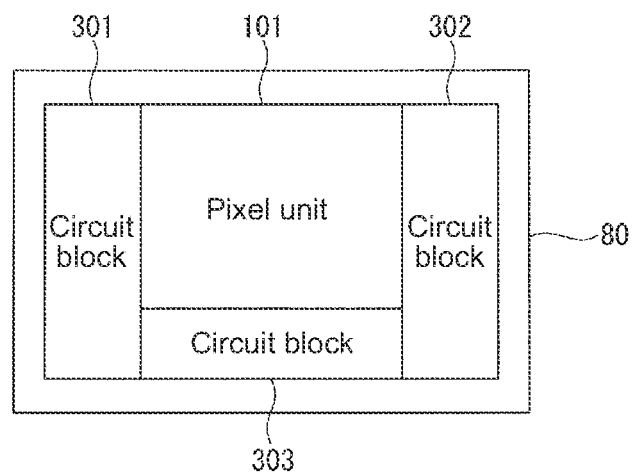
FIG. 15 is a schematic diagram showing a configuration example in the case where the image sensor according to the embodiment of the present technology includes one bare chip.

As shown in FIG. 15, in the case where the image sensor includes one bare chip, for example, the pixel unit 101 is formed on one bare chip 80. Circuit blocks 301, 302, and 303 that include circuits other than the pixel unit 101, such as the ADC group 12, the timing control circuit 102, the vertical scanning circuit 103, the DAC 104, and the horizontal transfer scanning circuit 106, are formed on a periphery of the pixel unit 101.

Figure 16:
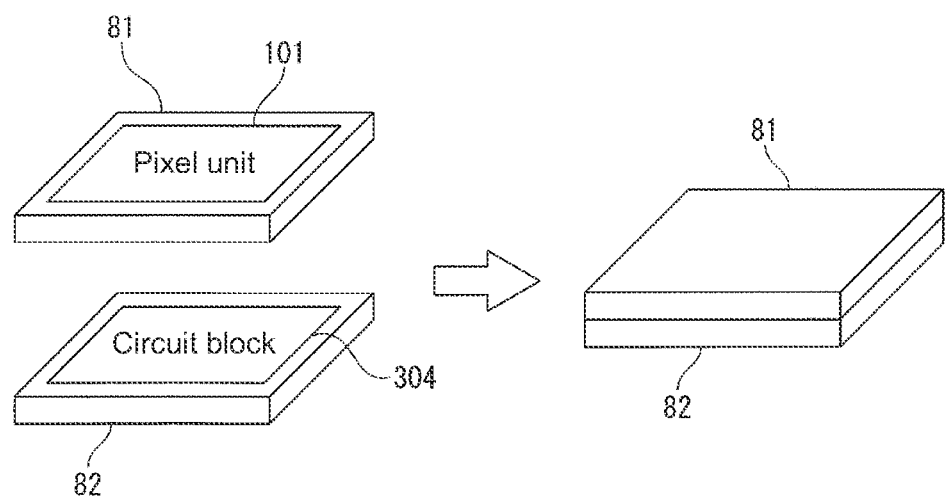
FIG. 16 is a schematic diagram showing a configuration example in the case where the image sensor according to the embodiment of the present technology includes two bare chips.

As shown in FIG. 16, in the case where a stacked image sensor is formed by two bare chips stacked one above the other, the pixel unit 101 is formed on an upper chip 81 stacked on the upper side of the two bare chips. Further, the circuit block 304 including circuits other than the pixel unit 101, such as the ADC group 12, the timing control circuit 102, the vertical scanning circuit 103, the DAC 104, and the horizontal transfer scanning circuit 106, is formed in a lower chip 82 stacked on the lower side. The ADC 105 including one of the comparators 121, 131, 141, and 161 is formed in the circuit block 304 provided on the lower chip 82. Note that the comparators 121, 131, 141, and 161 and the ADC 105 may be formed in the upper chip 81.

As shown in FIG. 16, in the case where a stacked image sensor is formed, i.e., in the case where an image sensor includes the upper chip 81 in which the pixel unit 101 is formed and the lower chip 82 in which the circuit block 304 is formed, it is sometimes required to form the lower chip 82 to have the same size as the upper chip 81.

The upper chip 81 in which the pixel unit 101 is formed can be configured to have a size similar to the size of the pixel unit 101 formed on the one bare chip 80 shown in FIG. 15. In the case where the lower chip 82 is configured to have the same size as the upper chip 81, all of the circuits included in the circuit blocks 301 to 303 shown in FIG. 15 need to be formed as the circuit block 304 in the lower chip 82 configured to have the same size as the upper chip 81.

Therefore, further miniaturization is required for the circuits such as the ADC group 12 included in the circuit block 304. For example, for the ADC 105, it is required to shorten the distance (column pitch) between adjacent columns than that in the case where the image sensor shown in FIG. 15 includes the one bare chip 80.

Even in such a case, the first resistance element R221 and the second resistance element R15 can be formed in a smaller region as compared with the first capacitance unit 26 and the second capacitance unit 27. For this reason, the image sensor according to the above-mentioned embodiment and the above-mentioned modified example can cope with miniaturization required for the circuits such as the ADC group 12.

The technology according to the present disclosure is applicable to the above-mentioned solid-state imaging device.

Further, the technology according to the present disclosure can be applied also to a photodetector including a distance measuring sensor.

Note that the embodiment of the present technology is not limited to the embodiments described above, and various modifications can be made without departing from the essence of the present technology. Further, the effects described herein are merely illustrative and not restrictive, and may have other effects.

for example, The present technology may also be configured as follows.

(1) An image sensor, including:
a pixel that includes a photoelectric conversion element;
a signal line connected to the pixel; and
a comparator connected to the signal line, in which the comparator includes
a differential input unit that includes a first input unit connected to a first capacitance unit and a second input unit connected to a second capacitance unit,
a current mirror unit that includes a first resistance element connected to the differential input unit and a transistor diode-connected via the first resistance element,
a second resistance element connected to the differential input unit, and
a switch unit provided between the first input unit and a junction between the first resistance element and the transistor, and between the second input unit and a junction between the second resistance element and the current mirror unit.

(2) The image sensor according to (1) above, in which
the differential input unit includes a first transistor that is connected to the first resistance element to constitute the first input unit, and a second transistor that is connected to the second resistance element to constitute the second input unit,
the current mirror unit includes a third transistor that is the transistor diode-connected via the first resistance element, and a fourth transistor connected to the second resistance element, and
the switch unit includes a first switch provided between a junction between the first transistor and the first capacitance unit and a junction between the first resistance element and the third transistor, and a second switch provided between a junction between the second transistor and the second capacitance unit and a junction between the second resistance element and the fourth transistor.

(3) The image sensor according to (2) above, in which
one terminal of the first resistance element is connected to a drain of the first transistor, a gate of the third transistor, and a gate of the fourth transistor, and a different terminal of the first resistance element is connected to a drain of the third transistor and the first switch, and
one terminal of the second resistance element is connected to a drain of the second transistor, and a different terminal of the second resistance element is connected to a drain of the fourth transistor and the second switch.

(4) The image sensor according to (2) or (3) above, further including
a current generation unit that generates a bias current for determining an operating point, in which
the current generation unit includes a reference resistance element of the same type as the first resistance element and the second resistance element, the reference resistance element determining a current value of a reference current that is a reference of the bias current.

(5) The image sensor according to (4) above, in which
at least a part of each of the first resistance element, the second resistance element, and the reference resistance element is formed of polysilicon.

(6) The image sensor according to any one of (1) to (5) above, in which
the first capacitance unit includes
a first capacitance connected to the signal line,
a second capacitance connected to a reference signal generation unit that generates a reference signal, and
a third capacitance provided to be connectable to the first capacitance and the second capacitance, and the second capacitance unit includes a fourth capacitance connected to a supply unit of a reference potential.

(7) The image sensor according to (6) above, in which
a switch is provided between the first capacitance and the third capacitance, and
a switch is provided between the second capacitance and the third capacitance.

(8) The image sensor according to (6) or (7) above, in which
the third capacitance includes a plurality of split capacitances, and
a switch is provided between respective adjacent split capacitances of the plurality of split capacitances.

(9) The image sensor according to any one of (1) to (8) above, in which
each of the first resistance element and the second resistance element includes a passive element.

(10) The image sensor according to any one of (1) to (9) above, in which
the first capacitance unit is connected to an input terminal to which a reference signal is input, and
the second capacitance unit is connected to the signal line.

(11) A photodetector, including:
a pixel that includes a photoelectric conversion element;
a signal line connected to the pixel; and
a comparator connected to the signal line, in which
the comparator includes
a differential input unit that includes a first input unit connected to a first capacitance unit and a second input unit connected to a second capacitance unit,
a current mirror unit that includes a first resistance element connected to the differential input unit and a transistor diode-connected via the first resistance element,
a second resistance element connected to the differential input unit, and
a switch unit provided between the first input unit and a junction between the first resistance element and the transistor, and between the second input unit and a junction between the second resistance element and the current mirror unit.

(12) The photodetector according to (11) above, in which
the differential input unit includes a first transistor that is connected to the first resistance element to constitute the first input unit, and a second transistor that is connected to the second resistance element to constitute the second input unit,
the current mirror unit includes a third transistor that is the transistor diode-connected via the first resistance element, and a fourth transistor connected to the second resistance element, and
the switch unit includes a first switch provided between a junction between the first transistor and the first capacitance unit and a junction between the first resistance element and the third transistor, and a second switch provided between a junction between the second transistor and the second capacitance unit and a junction between the second resistance element and the fourth transistor.

(13) The photodetector according to (12) above, in which
one terminal of the first resistance element is connected to a drain of the first transistor, a gate of the third transistor, and a gate of the fourth transistor, and a different terminal of the first resistance element is connected to a drain of the third transistor and the first switch, and one terminal of the second resistance element is connected to a drain of the second transistor, and a different terminal of the second resistance element is connected to a drain of the fourth transistor and the second switch.

(14) The photodetector according to (12) or (13) above, further including
a current generation unit that generates a bias current for determining an operating point, in which
the current generation unit includes a reference resistance element of the same type as the first resistance element and the second resistance element, the reference resistance element determining a current value of a reference current that is a reference of the bias current.

(15) The photodetector according to (14) above, in which
at least a part of each of the first resistance element, the second resistance element, and the reference resistance element is formed of polysilicon.

(16) The photodetector according to any one of (11) to (15) above, in which
the first capacitance unit includes
a first capacitance connected to the signal line,
a second capacitance connected to a reference signal generation unit that generates a reference signal, and
a third capacitance provided to be connectable to the first capacitance and the second capacitance, and
the second capacitance unit includes a fourth capacitance connected to a supply unit of a reference potential.

(17) The photodetector according to (16) above, in which
a switch is provided between the first capacitance and the third capacitance, and
a switch is provided between the second capacitance and the third capacitance.

(18) The photodetector according to (16) or (17) above, in which
the third capacitance includes a plurality of split capacitances, and
a switch is provided between respective adjacent split capacitances of the plurality of split capacitances.

(19) The photodetector according to any one of (11) to (18) above, in which
each of the first resistance element and the second resistance element includes a passive element.

(20) The photodetector according to any one of (11) to (19) above, in which
the first capacitance unit is connected to an input terminal to which a reference signal is input, and
the second capacitance unit is connected to the signal line.

REFERENCE SIGNS LIST 1 image sensor
2 optical system
3 memory
4 signal processing unit
5 output unit
6 control unit
12 ADC group
20, 30 differential amplifier
21, 31 differential input unit
22, 32 current mirror unit
23, 33 tail current source
24 switch unit
26 first capacitance unit
27 second capacitance unit
28 switch group
80 bare chip
81 upper chip 82 lower chip
90 current generation unit
91 bias current generation circuit
92 comparator bias circuit
100 digital camera
101 pixel unit
102 timing control circuit
103 vertical scanning circuit
105 ADC
106 horizontal transfer scanning circuit
107 amplifier circuit
108 signal processing circuit
109, 109-1, 109-m pixel drive line
110, 110-1, 110-1, 110-2, 110-3, 110-n vertical signal line
111 horizontal transfer line
121, 121-1, 121-2, 121-3, 121-n, 131, 141, 161 comparator
122, 122-1, 122-2, 122-3, 122-n counter
123, 123-1, 123-2, 123-3, 123-n latch
151 photodiode
152 transfer transistor
154 amplifier transistor
155 selection transistor
156 reset transistor
157 constant current source
161 comparator
211, 311 first input unit
212, 312 second input unit
263 capacitance group
301, 302, 303, 304 circuit block
911 BGR circuit
912 amplifier
921 current mirror circuit
C28 bandwidth limit capacitance
C105, C260, C262, C262, C263a, C263b, C263c, C270, C271, C921 capacitor
NT211, NT212, NT221, NT222, NT311, NT312, NT322, NT331, NT921a, NT921b NMOS transistor
P, P11, Pi1, Pin, Pmn unit pixel
PT211, PT212, PT231, PT311, PT312, PT321, PT322, PT331, PT913, PT914, PT921a, PT922 PMOS transistor
R15 second resistance element
R221 first resistance element
R911 reference resistance element
R912 resistance element
SW105, SW211, SW212, SW241, SW242, SW281, SW282, SW283, SW284, SW384 switch
T21, T22, T23, T24 input terminal
T25 output terminal

The invention claimed is:

1. An image sensor, comprising:
a pixel that includes a photoelectric conversion element;
a signal line connected to the pixel; and
a comparator connected to the signal line, wherein
the comparator includes:
  a differential input unit that includes a first input unit connected to a first capacitance unit and a second input unit connected to a second capacitance unit,
  a current mirror unit that includes a first resistance element connected to the differential input unit and a transistor diode-connected via the first resistance element,
  a second resistance element connected to the differential input unit, and
  a switch unit provided between the first input unit and a junction between the first resistance element and the transistor, and between the second input unit and a junction between the second resistance element and the current mirror unit.

2. The image sensor according to claim 1, wherein
the differential input unit includes a first transistor that is connected to the first resistance element to constitute the first input unit, and a second transistor that is connected to the second resistance element to constitute the second input unit,
the current mirror unit includes a third transistor that is the transistor diode-connected via the first resistance element, and a fourth transistor connected to the second resistance element, and
the switch unit includes a first switch provided between a junction between the first transistor and the first capacitance unit and a junction between the first resistance element and the third transistor, and a second switch provided between a junction between the second transistor and the second capacitance unit and a junction between the second resistance element and the fourth transistor.

3. The image sensor according to claim 2, wherein
one terminal of the first resistance element is connected to a drain of the first transistor, a gate of the third transistor, and a gate of the fourth transistor, and a different terminal of the first resistance element is connected to a drain of the third transistor and the first switch, and
one terminal of the second resistance element is connected to a drain of the second transistor, and a different terminal of the second resistance element is connected to a drain of the fourth transistor and the second switch.

4. The image sensor according to claim 2, further comprising
a current generation unit that generates a bias current for determining an operating point, wherein
the current generation unit includes a reference resistance element of same type as the first resistance element and the second resistance element, the reference resistance element determining a current value of a reference current that is a reference of the bias current.

5. The image sensor according to claim 4, wherein
at least a part of each of the first resistance element, the second resistance element, and the reference resistance element is formed of polysilicon.

6. The image sensor according to claim 1, wherein
the first capacitance unit includes:
  a first capacitance connected to the signal line,
  a second capacitance connected to a reference signal generation unit that generates a reference signal, and
  a third capacitance provided to be connectable to the first capacitance and the second capacitance, and
the second capacitance unit includes a fourth capacitance connected to a supply unit of a reference potential.

7. The image sensor according to claim 6, wherein
a switch is provided between the first capacitance and the third capacitance, and
a switch is provided between the second capacitance and the third capacitance.

8. The image sensor according to claim 6, wherein
the third capacitance includes a plurality of split capacitances, and
a switch is provided between respective adjacent split capacitances of the plurality of split capacitances.

9. The image sensor according to claim 1, wherein
each of the first resistance element and the second resistance element includes a passive element.

10. The image sensor according to claim 1, wherein
the first capacitance unit is connected to an input terminal to which a reference signal is input, and
the second capacitance unit is connected to the signal line.

11. A photodetector, comprising:
a pixel that includes a photoelectric conversion element;
a signal line connected to the pixel; and
a comparator connected to the signal line, wherein
the comparator includes:
- a differential input unit that includes a first input unit connected to a first capacitance unit and a second input unit connected to a second capacitance unit,
- a current mirror unit that includes a first resistance element connected to the differential input unit and a transistor diode-connected via the first resistance element,
- a second resistance element connected to the differential input unit, and
- a switch unit provided between the first input unit and a junction between the first resistance element and the transistor, and between the second input unit and a junction between the second resistance element and the current mirror unit.

12. The photodetector according to claim 11, wherein
the differential input unit includes a first transistor that is connected to the first resistance element to constitute the first input unit, and a second transistor that is connected to the second resistance element to constitute the second input unit,
the current mirror unit includes a third transistor that is the transistor diode-connected via the first resistance element, and a fourth transistor connected to the second resistance element, and
the switch unit includes a first switch provided between a junction between the first transistor and the first capacitance unit and a junction between the first resistance element and the third transistor, and a second switch provided between a junction between the second transistor and the second capacitance unit and a junction between the second resistance element and the fourth transistor.

13. The photodetector according to claim 12, wherein
one terminal of the first resistance element is connected to a drain of the first transistor, a gate of the third transistor, and a gate of the fourth transistor, and a different terminal of the first resistance element is connected to a drain of the third transistor and the first switch, and
one terminal of the second resistance element is connected to a drain of the second transistor, and a different terminal of the second resistance element is connected to a drain of the fourth transistor and the second switch.

14. The photodetector according to claim 12, further comprising
a current generation unit that generates a bias current for determining an operating point, wherein
the current generation unit includes a reference resistance element of same type as the first resistance element and the second resistance element, the reference resistance element determining a current value of a reference current that is a reference of the bias current.

15. The photodetector according to claim 14, wherein
at least a part of each of the first resistance element, the second resistance element, and the reference resistance element is formed of polysilicon.

16. The photodetector according to claim 11, wherein
the first capacitance unit includes:
- a first capacitance connected to the signal line,
- a second capacitance connected to a reference signal generation unit that generates a reference signal, and
- a third capacitance provided to be connectable to the first capacitance and the second capacitance, and
the second capacitance unit includes a fourth capacitance connected to a supply unit of a reference potential.

17. The photodetector according to claim 16, wherein
a switch is provided between the first capacitance and the third capacitance, and
a switch is provided between the second capacitance and the third capacitance.

18. The photodetector according to claim 16, wherein
the third capacitance includes a plurality of split capacitances, and
a switch is provided between respective adjacent split capacitances of the plurality of split capacitances.

19. The photodetector according to claim 11, wherein
each of the first resistance element and the second resistance element includes a passive element.

20. The photodetector according to claim 11, wherein
the first capacitance unit is connected to an input terminal to which a reference signal is input, and
the second capacitance unit is connected to the signal line.

* * * * *